United States Patent
Park et al.

(10) Patent No.: US 10,720,282 B2
(45) Date of Patent: Jul. 21, 2020

(54) PRODUCING METHOD OF MESOPOROUS THIN FILM SOLAR CELL BASED ON PEROVSKITE

(71) Applicant: RESEARCH & BUSINESS FOUNDATION SUNGKYUNKWAN UNIVERSITY, Suwon-si (KR)

(72) Inventors: Nam-Gyu Park, Seoul (KR); Huiseon Kim, Suwon-si (KR); Changryul Lee, Seoul (KR); Jeong-Hyeok Im, Incheon (KR)

(73) Assignee: Research & Business Foundation Sungkyunkwan University, Suwon-si (KR)

( * ) Notice: Subject to any disclaimer, the term of this patent is extended or adjusted under 35 U.S.C. 154(b) by 333 days.

(21) Appl. No.: 14/585,020

(22) Filed: Dec. 29, 2014

(65) Prior Publication Data
US 2015/0122325 A1 May 7, 2015

Related U.S. Application Data

(63) Continuation of application No. PCT/KR2013/002534, filed on Mar. 27, 2013.

(30) Foreign Application Priority Data

Jun. 29, 2012 (KR) .................. 10-2012-0070993
Mar. 26, 2013 (KR) .................. 10-2013-0032089

(51) Int. Cl.
*H01G 9/00* (2006.01)
*H01G 9/20* (2006.01)
(Continued)

(52) U.S. Cl.
CPC ......... *H01G 9/0029* (2013.01); *H01G 9/2059* (2013.01); *H01L 51/0032* (2013.01);
(Continued)

(58) Field of Classification Search
CPC .. H01G 9/2027; H01G 9/2031; H01G 9/2036; H01G 9/204; H01G 9/2059; H01G 9/2095
See application file for complete search history.

(56) References Cited

U.S. PATENT DOCUMENTS

| | | | |
|---|---|---|---|
| 5,350,644 A | 9/1994 | Graetzel et al. | |
| 2004/0089540 A1* | 5/2004 | Van Heuveln | C01G 51/68 204/293 |

(Continued)

FOREIGN PATENT DOCUMENTS

| | | |
|---|---|---|
| KR | 10-2008-0079894 A | 9/2008 |
| KR | 10-1055117 B1 | 8/2011 |

OTHER PUBLICATIONS

Im et al., "6.5% efficient perovskite quantum-dot-sensitized solar cell," Nanoscale, 2011, 3, 4088.*

(Continued)

*Primary Examiner* — Eli S Mekhlin
(74) *Attorney, Agent, or Firm* — NSIP Law

(57) ABSTRACT

The present disclosure described herein generally relates to a dye-sensitized solar cell including an organic-inorganic composite dye having a perovskite structure, and a producing method of the same.

8 Claims, 13 Drawing Sheets

(51) Int. Cl.
*H01L 51/00* (2006.01)
*H01L 51/42* (2006.01)

(52) U.S. Cl.
CPC ........ *H01G 9/2031* (2013.01); *H01L 51/4226* (2013.01); *Y02E 10/542* (2013.01); *Y02E 10/549* (2013.01)

(56) References Cited

U.S. PATENT DOCUMENTS

| | | | |
|---|---|---|---|
| 2005/0183769 A1* | 8/2005 | Nakagawa | H01G 9/2031 136/263 |
| 2008/0092955 A1* | 4/2008 | Zhang | H01G 9/2031 136/263 |
| 2008/0128665 A1* | 6/2008 | Wu | C09K 9/02 252/518.1 |
| 2009/0038676 A1* | 2/2009 | Monden | H01G 9/204 136/252 |
| 2009/0135545 A1* | 5/2009 | Thomas | H01G 4/005 361/305 |
| 2010/0139761 A1* | 6/2010 | Yun | H01G 9/2031 136/256 |
| 2011/0155228 A1* | 6/2011 | Tung | H01L 51/4226 136/255 |
| 2011/0226325 A1* | 9/2011 | Morooka | H01G 9/2031 136/256 |
| 2012/0048337 A1* | 3/2012 | Fukui | H01G 9/2031 136/244 |

OTHER PUBLICATIONS

Kojima et al., J. Am. Chem. Soc., 2009, 131, 6050-6051.*
Li et al., Mater. Lett., 64 (2010) 2735-2737.*
Tanaka, Kenichiro, et al. "Comparative study on the excitons in lead-halide-based perocskite-type crystals CH3NH3PbBr3 CH3NH3PbI3," Solid State Communications, Sep. 2003, pp. 619-623.
Kojima, Akihiro, et al. "Organometal Halide Perovskites as Visible-Light Sensitizers for Photovoltaic Cells." Journal of the American Chemical Society, Apr. 2009 (3 pages, in English).
Im, Jeong-Hyeok, et al. "Synthesis, structure, and photovoltaic property of a nanocrystalline 2H perovskite-type novel sensitizer (CH3CH2NH3) PbI3." Nanoscale Research Letters vol. 7, Jun. 2012, pp. 1-7.
International Search Report dated Jun. 27, 2013, in counterpart International Application No. PCT/KR2013/002534 (2 pages, in English).
Kim, Hui-Seon et al., "Lead Iodide Perovskite All-Solid-State Submicron Thin Film Mesoscopic Solar Cell with Efficiency Exceeding 9%", *Scientific Reports*, Aug. 21, 2012 (pp. 1-7).

* cited by examiner

PRODUCING METHOD OF MESOPOROUS THIN FILM SOLAR CELL BASED ON PEROVSKITE

CROSS-REFERENCE TO RELATED APPLICATIONS

This application is a continuation application of International Application No. PCT/KR2013/002534 filed on Mar. 27, 2013, claiming priority based on Korean Patent Application No. 10-2012-0070993 filed on Jun. 29, 2012 and Korean Patent Application No. 10-2013-0032089 filed on Mar. 26, 2013, the entire disclosures of which are incorporated herein by reference for all purposes.

BACKGROUND

1. Field

The present disclosure described herein pertains generally to a dye-sensitized solar cell including an organic-inorganic composite dye having a perovskite structure, and a producing method of the same.

2. Description of Related Art

In general, a solar cell is a device for converting solar light energy into electric energy. The solar cell is a means that produces electricity by using solar light, which is an effectively unlimited energy source, and a representative example of the solar cell includes a silicon solar cell, which has been already widely used. In addition, a dye-sensitized solar cell has been recently researched as a next-generation solar cell. The dye-sensitized solar cell is a photoelectrochemical solar cell, which has potential to replace the previous silicon-type solar cell since it exhibits higher efficiency and can be produced at significantly lower costs.

A representative dye-sensitized solar cell was announced by Michael Gratzel's research group at the National Higher Institute of Technology of Lausanne (EPFL) in Switzerland in 1991 (see U.S. Pat. No. 5,350,644). In terms of a structure, one of two (2) electrodes of the dye-sensitized solar cell is a photoelectrode including a transparent conductive substrate. A semiconductor layer, to which photosensitive dye is adsorbed, is formed on the transparent conductive substrate. And the space between the two (2) electrodes is filled with an electrolyte.

With respect to the operation principle of the dye-sensitized solar cell, solar energy is absorbed by a photosensitive dye adsorbed to the semiconductor layer of the electrode to generate photoelectrons. The photoelectrons are then conducted through the semiconductor layer to be transferred to the transparent conductive substrate, on which a transparent electrode is formed. The dye losing electrons to be oxidized is reduced by redox pairs included in the electrolyte. Meanwhile, the electrons that have reached a counter electrode, which is an opposite electrode, through a external wire reduce the redox pairs in the oxidized electrolyte to complete the operation process of the solar cell.

Compared to a conventional solar cell, the dye-sensitized solar cell includes various interfaces such as an interface between a semiconductor and a dye, an interface between a semiconductor and an electrolyte, an interface between a semiconductor and a transparent electrode, and an interface between an electrolyte and a counter electrode. Understanding and controlling physical/chemical behaviors at each of these interfaces are the core technology of the dye-sensitized solar cell. In addition, energy conversion efficiency of the dye-sensitized solar cell is proportional to an amount of photoelectrons generated by absorption of solar energy. In order to produce a large amount of photoelectrons, it is demanded to produce a photoelectrode including a structure capable of increasing an amount of absorbed dye molecules.

An electrolyte used in the dye-sensitized solar cell may be a liquid electrolyte, a gel-type electrolyte, and a solid electrolyte, depending on its physical form. In the case of producing a solar cell by using a liquid electrolyte, the energy conversion efficiency tends to increase, whereas a solvent included in the liquid electrolyte tends to be leaked or volatilized depending on an increase of an external temperature or the sealing state of the solar cell, thereby reducing the lifetime of the solar cell. On the other hand, in the case of producing a solar cell by using a solid electrolyte, leakage or volatilization of the electrolyte tends to not occur, but the energy conversion efficiency generally tends to decrease, and thereby results in difficulty in solar cell application. Thus, there has been a need to develop a novel electrolyte or develop and apply a novel material that can replace electrolyte in order to solve the above-described problems.

In general, a ruthenium (Ru) metal complex has been widely used as a dye used for the dye-sensitized solar cell, but the ruthenium metal complex is highly expensive and cannot be easily purified. Also, an organic dye including ruthenium metal tends to require a long adsorption time of at least two (2) hours up to twenty-four (24) hours to be adsorbed to a semiconductor layer, and thereby increases the time required for the production process. Accordingly, high energy conversion efficiency is achieved only when a thickness of the semiconductor layer is at least about 10 μm. Thus, there have been attempts to use a dye other than the ruthenium metal complex, but in these cases, an energy conversion efficiency is achieved of only a maximum of about 3% when the thickness of the semiconductor layer is around 10 μm. A high energy conversion efficiency could not be achieved when the thickness of the semiconductor layer is thinner than 10 μm.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a dye-sensitized solar cell includes a first electrode including a transparent conductive substrate; a light absorption layer formed on the first electrode; a hole transport layer formed on the light absorption layer; and a second electrode formed on the hole transport layer, wherein the light absorption layer includes a semiconductor layer and a dye represented by the following Chemical Formula 1:

$$RMX_3, \qquad \text{[Chemical Formula 1]}$$

in the Chemical Formula 1, R is an alkyl group of $C_{1-20}$, an alkyl group substituted with an amine group, or an alkali metal, M is a member selected from the group consisting of Pb, Sn, Ti, Nb, Zr, and Ce, and X is halogen.

The transparent conductive substrate may include a glass substrate containing a material selected from the group consisting of an indium tin oxide (ITO), a fluorine tin oxide (FTO), ZnO—Ga$_2$O$_3$, ZnO—Al$_2$O$_3$, a tin-based oxide, a zinc oxide, and combinations thereof, or a plastic substrate, and combinations thereof.

The plastic substrate may include a polymer selected from the group consisting of polyethylene terephthalate (PET), poly ethylene naphthalate (PEN), poly carbonate (PC), polypropylene (PP), polyimide (PI), tri-acetyl cellulose (TAC), and combinations thereof.

The semiconductor layer may include a metal oxide.

The semiconductor layer may include an oxide of a metal selected from the group consisting of titanium, tin, zinc, tungsten, zirconium, gallium, indium, yttrium, niobium, tantalum, vanadium, and combinations thereof.

The semiconductor layer may include a metal oxide selected from the group consisting of TiO$_2$, SnO$_2$, ZnO, WO$_3$, Nb$_2$O$_5$, TiSrO$_3$, and combinations thereof.

The semiconductor layer may have a thickness of 3.0 μm or less.

The semiconductor layer may have a thickness of about 1.0 μm or less.

The dye may have a perovskite structure.

The dye may have a concentration of from 30 wt % to 50 wt %.

The hole transport layer may include a unimolecular or polymeric hole transport material.

The second electrode may include a member selected from the group consisting of Pt, Au, Ni, Cu, Ag, In, Ru, Pd, Rh, Ir, Os, C, a conductive polymer, and combinations thereof.

In another general aspect, a producing method of the dye-sensitized solar cell according includes: forming the semiconductor layer on the first electrode including the transparent conductive substrate; adsorbing the dye represented by Chemical Formula 1 to the semiconductor layer, followed by heat treatment to form the light absorption layer; forming the hole transport layer on the light absorption layer; and forming the second electrode on the hole transport layer.

The semiconductor layer may include a metal oxide selected from the group consisting of TiO$_2$, SnO$_2$, ZnO, WO$_3$, Nb$_2$O$_5$, TiSrO$_3$, and combinations thereof.

The semiconductor layer may be formed on the first electrode by a doctor blade method, a screen printing method, a spin coating method, or a spraying method.

The semiconductor layer may have a thickness of 3.0 μm or less.

The semiconductor layer may have a porous structure.

The producing method of the dye-sensitized solar cell may further include coating a polymer on the semiconductor layer followed by heat treatment.

The polymer may include a member selected from the group consisting of ethylenecellulose, hydroxypropylcellulose, polyethyleneglycol, polyethyleneoxide, polyvinylalcohol, polyvinylpyrrolidone, and combinations thereof.

The dye may have a perovskite structure.

The dye may have a concentration of from 30 wt % to 50 wt %.

The forming the light absorption layer may include coating a precursor solution of the dye represented by the Chemical Formula 1 on the semiconductor layer, followed by heat treatment at from 40° C. to 300° C.

The hole transport layer may include a unimolecular or polymeric hole transport material.

The second electrode may include a member selected from the group consisting of Pt, Au, Ni, Cu, Ag, In, Ru, Pd, Rh, Ir, Os, C, a conductive polymer, and combinations thereof.

Other features and aspects will be apparent from the following detailed description, the drawings, and the claims.

BRIEF DESCRIPTION OF THE DRAWINGS

The patent or application file contains a least one drawing executed in color. Copies of this patent or patent application publication with color drawing(s) will be provided by the Office upon request and payment of the necessary fee.

FIG. 1A is a schematic view schematically illustrating a layer structure of a dye-sensitized solar cell in accordance with a first aspect of the present disclosure, FIG. 1B is a SEM photograph of a layer structure of a dye-sensitized solar cell produced in accordance with an Example of the present disclosure, and FIG. 1C is a photograph of a dye-sensitized solar cell produced in accordance with an Example of the present disclosure.

FIG. 2B is a graph for a photocurrent-voltage characteristic according to variation in a thickness of a semiconductor layer included in the dye-sensitized solar cell, and FIG. 2C is a graph for a photocurrent-voltage characteristic when the highest energy conversion efficiency is achieved.

Figure 1A:
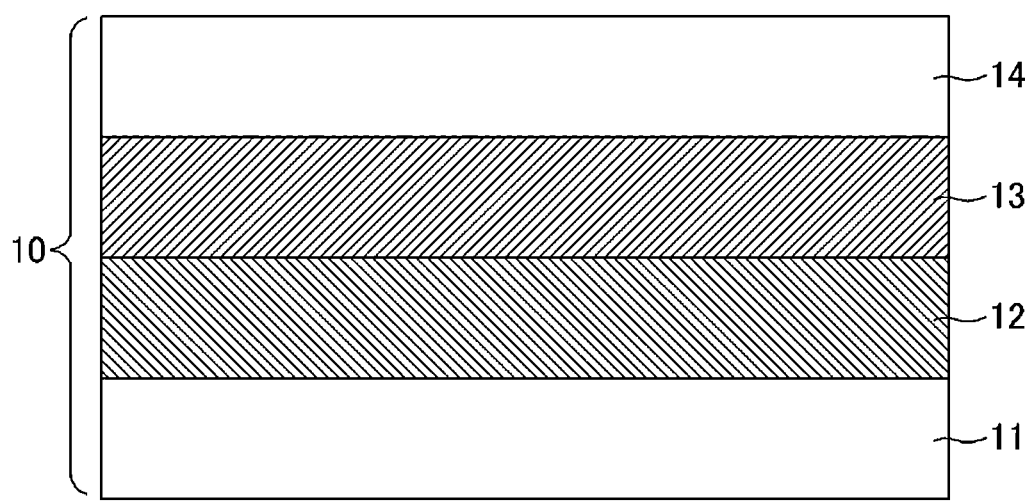
FIGS. 1A through 1C illustrate an example of a dye-sensitized solar cell of the present disclosure. Specifically.

Throughout the drawings and the detailed description, unless otherwise described or provided, the same drawing reference numerals will be understood to refer to the same elements, features, and structures. The drawings may not be to scale, and the relative size, proportions, and depiction of elements in the drawings may be exaggerated for clarity, illustration, and convenience.

DETAILED DESCRIPTION

Hereinafter, the present disclosure will be described in detail with reference to the accompanying drawings so that inventive concept may be readily implemented by those skilled in the art. However, it is to be noted that the present disclosure is not limited to the present disclosure, but can be realized in various other ways. In the drawings, the present disclosure not directly relevant to the description are omitted to enhance the clarity of the drawings, and like reference numerals denote like parts throughout the whole document of the present disclosure.

The detailed description is provided to assist the reader in gaining a comprehensive understanding of the methods, apparatuses, and/or systems described herein. However, various changes, modifications, and equivalents of the systems, apparatuses and/or methods described herein will be apparent to one of ordinary skill in the art. The progression of processing steps and/or operations described is an example; however, the sequence of and/or operations is not limited to that set forth herein and may be changed as is known in the art, with the exception of steps and/or operations necessarily occurring in a certain order. Also, descriptions of functions and constructions that are well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will convey the full scope of the disclosure to one of ordinary skill in the art.

Throughout the whole document of the present disclosure, the terms "connected to" or "coupled to" are used to designate a connection or coupling of one element to another element and include both a case where an element is "directly connected or coupled to" another element and a case where an element is "electronically connected or coupled to" another element via still another element.

Throughout the whole document of the present disclosure, the term "on" that is used to designate a position of one element with respect to another element includes both a case that the one element is adjacent to the another element and a case that any other element exists between these two elements.

Throughout the whole document of the present disclosure, the term "comprises or includes" and/or "comprising or including" means that one or more other components, steps, operations, and/or the existence or addition of elements are not excluded in addition to the described components, steps, operations and/or elements. Throughout the whole document of the present disclosure, the terms "about or approximately" or "substantially" are intended to have meanings close to numerical values or ranges specified with an allowable error and intended to prevent accurate or absolute numerical values disclosed for understanding of the present invention from being illegally or unfairly used by any unconscionable third party. Throughout the whole document of the present disclosure, the term "step of" does not mean "step for."

Throughout the whole document of the present disclosure, the term "combinations of" included in Markush type description means mixture or combinations of one or more components, steps, operations and/or elements selected from a group consisting of components, steps, operation and/or elements described in Markush type and thereby means that the disclosure includes one or more components, steps, operations and/or elements selected from the Markush group.

Hereinafter, illustrative embodiment and Examples of the present disclosure will be explained with reference to the accompanying drawings.

Unlike the conventional dye-sensitized solar cell, the dye-sensitized solar cell of the present disclosure uses the a having a perovskite structure, and not a ruthenium metal complex, as a photosensitizer, and thus avoids, e.g., high costs, long time required for dye adsorption, a thick light absorption layer required for achievement of high energy conversion efficiency, and others. Specifically, the ruthenium metal complex used as a dye in the conventional dye-sensitized solar cells is expensive and requires long adsorption time of at least about two (2) hours up to about twenty-four (24) hours to be adsorbed to a semiconductor layer so as to form a light absorption layer, and thereby, lengthens the time required for the production process. On the other hand, the dye-sensitized solar cell including the organic-inorganic composite dye having the perovskite structure of the present disclosure has significantly reduced adsorption time since electron movement by physical contact between the organic-inorganic composite dye having the perovskite structure and a surface of the semiconductor layer is possible. In addition, in the conventional dye-sensitized solar cell including the ruthenium metal complex, it has been necessary to secure thickness of about 10 μm for the semiconductor layer included in the light absorption layer in order to achieve high energy conversion efficiency. However, the dye-sensitized solar cell of the present disclosure can achieve high energy conversion efficiency even when the semiconductor layer has a significantly thin thickness, compared to that of the conventional dye-sensitized solar cell. Accordingly, as the thickness of the semiconductor layer can be adjusted to be thin, the production costs for the dye-sensed solar cell can be reduced, and the dye-sensitized solar cell can be produced in a flexible device form.

Meanwhile, unlike the conventional dye-sensitized solar cell, the dye-sensitized solar cell of the present disclosure includes a hole transport layer, and not a liquid electrolyte, which reduces the life time of the solar cell resulting from leakage or volatilization of the solvent included in the liquid electrolyte depending on increase in an external temperature and the sealing state of the solar cell. That is, the dye-sensitized solar cell of the present disclosure obtains high long-term stability. Furthermore, since the organic-inorganic composite dye having the perovskite structure included as a dye in the dye-sensitized solar cell of the present disclosure has low stability in general liquid electrolyte, there may be difficulty in using the dye in such a liquid electrolyte. However, the present disclosure employs a hole transport layer including a hole transport material, which is a unimolecular material, instead of the liquid electrolyte.

Meanwhile, since the hole transport material included in the hole transport layer has a short hole movement characteristic, it cannot be easily applied when a thickness of the light absorption layer included in the dye-sensitized solar cell is thick. Since a conventional light absorption layer including a ruthenium metal complex as a dye cannot improve the energy conversion efficiency due to reduction of current density when a thickness of the light absorption layer is thin, there has been difficulty in combining the light absorption layer with the hole transport layer. However, since the dye-sensitized solar cell of the present disclosure uses the light absorption layer including the organic-inorganic composite dye having the perovskite structure, instead of the ruthenium metal complex, and the dye has a high light absorption coefficient, it is possible to secure high current density and high energy conversion efficiency even when the thickness of the light absorption layer is thin. The light absorption layer is suitable for combination with the hole transport layer. Accordingly, the dye-sensitized solar cell having the organic-inorganic composite dye having the perovskite structure and the hole transport layer in the present disclosure includes the light absorption layer having a thin thickness and can secure high efficiency and long stability.

Figure 1B:
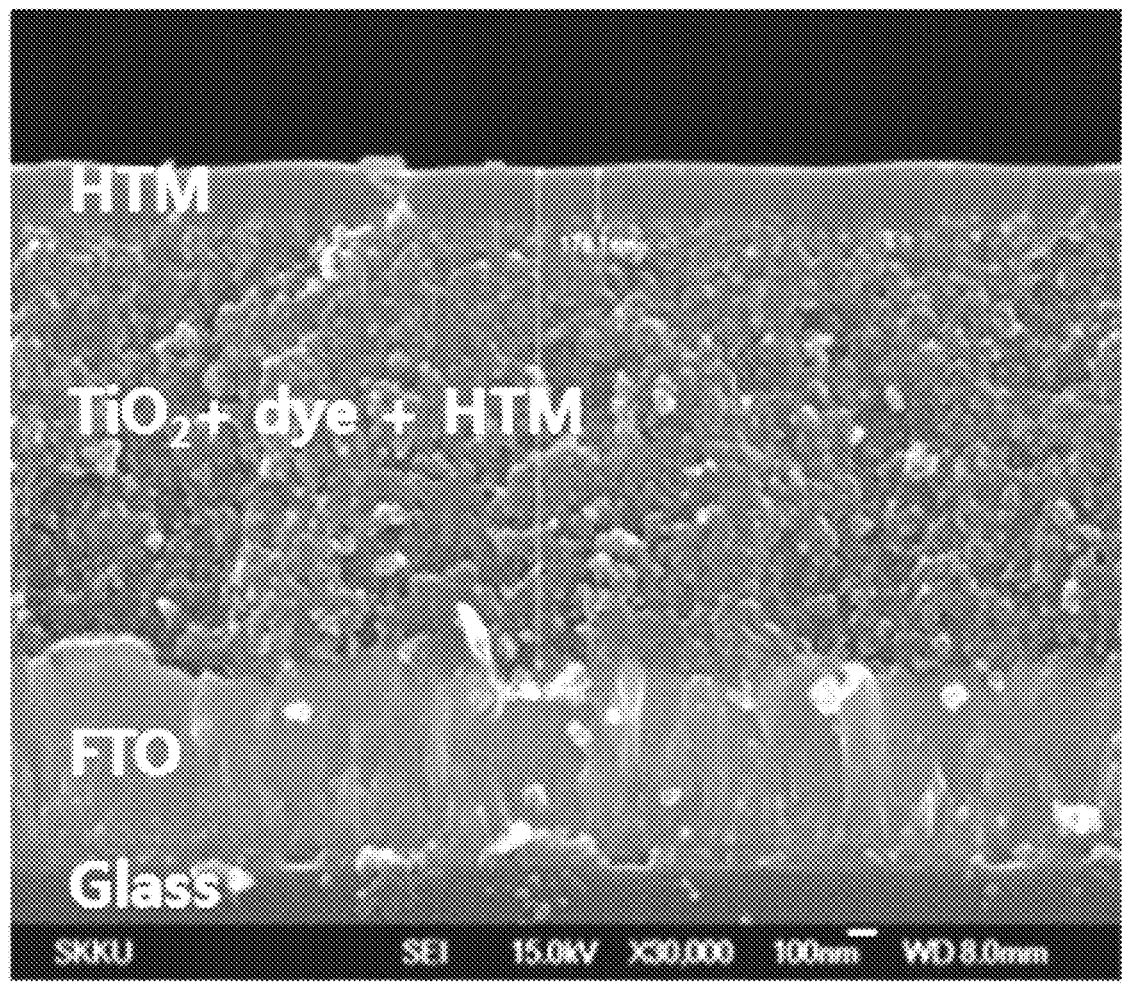
Figure 1C:
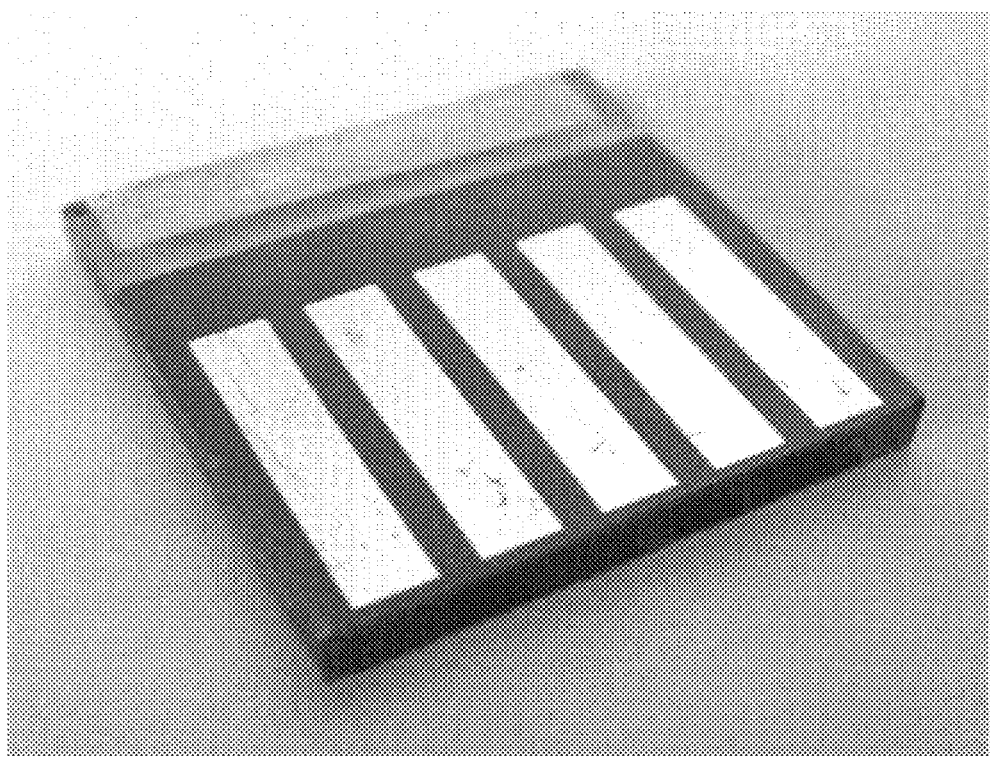

In this regard, FIGS. 1A through 1C illustrate a structure of the dye-sensitized solar cell of the present disclosure.

Specifically, FIG. 1A is a schematic view schematically showing a layer structure of the dye-sensitized solar cell in accordance with a first aspect of the present disclosure, FIG. 1B is an SEM photograph of a layer structure of a dye-sensitized solar cell produced in accordance with an Example of the present disclosure, and FIG. 1C is a photograph of the dye-sensitized solar cell produced in accordance with an Example of the present disclosure.

With reference to FIG. 1A, a dye-sensitized solar cell 10 of the present disclosure may have a sandwich structure, in which two (2) electrodes, i.e., a first electrode 11 and a second electrode 14 are in surface contact with each other, but is not limited thereto. For example, the first electrode 11 may be represented as a working electrode or a semiconductor electrode, and the second electrode 14 may be represented as a counter electrode, but is not limited thereto. On the first electrode 11, there may be formed a light absorption layer 12. The light absorption layer 12 may include a semiconductor layer and photosensitive dye adsorbed to the semiconductor layer and capable of absorbing visible ray to excitate electrons. On the light absorption layer 12, there may be formed a hole transport layer 13, and on the hole transport layer 13, there may be formed the second electrode 14. The hole transport layer 13 is represented as HTM (hole transport material) in the SEM photograph of FIG. 1B. The hole transport layer 13 may be formed for the purpose of reducing the light absorption layer 12 that has been oxidized, but is not limited thereto. In addition, the hole transport layer 13 is not limited to a hole transport layer formed as one plane on the light absorption layer 12. A part of the hole transport layer 13 may be in a form that penetrates into a porous semiconductor layer included in the light absorption layer 12.

The following is provided to illustratively and briefly describe the operation principle of the dye-sensitized solar cell. When solar light is incident into the dye-sensitized solar cell, photons are first absorbed into photosensitive dye molecules within the light absorption layer 12. The dye molecules accordingly undergo electronic-transition from the ground state to the excitation state to form electron-hole pairs, and the electrons in the excitation state may be injected into a conduction band of a semiconductor particle interface. The injected electrons may be transferred to the first electrode 11 through an interface, and thereafter, may be moved to the second electrode 14, which is a facing counter electrode, through an external circuit. Meanwhile, the dye oxidized as a result of the electronic-transition may be reduced by ions of oxidation-reduction couples within the hole transport layer 13, and the oxidized ions may be subject to reduction reaction with electrons that have reached the interface of the second electrode 14 in order to accomplish charge neutrality, so that the dye-sensitized solar cell can continue to operate. However, the present disclosure is not limited thereto.

In accordance with an illustrative embodiment of the present disclosure, the transparent conductive substrate may include a glass substrate containing a material selected from the group consisting of an indium tin oxide (ITO), a fluorine tin oxide (FTO), $ZnO-Ga_2O_3$, $ZnO-Al_2O_3$, a tin-based oxide, a zinc oxide, and combinations thereof, or a plastic substrate, but is not limited thereto. For the transparent conductive substrate, any material having conductivity and transparency may be used without limitation. For example, if ITO is used as the transparent conductive substrate, it may contribute to cost reduction, and if $SnO_2$, which is one of tin-based oxides, is used as the transparent conductive substrate, transparency and heat resistance are excellent. However, the present disclosure is not limited thereto.

In accordance with an illustrative embodiment of the present disclosure, a plastic substrate may include a polymer selected from the group consisting of polyethylene terephthalate (PET), poly ethylene naphthalate (PEN), poly carbonate (PC), polypropylene (PP), polyimide (PI), tri-acetyl cellulose (TAC), and combinations thereof, but is not limited thereto.

For example, the transparent conductive substrate may be doped with metal selected from the group consisting of Group III metals, e.g., Al, Ga, In, Ti and combinations thereof, but is not limited thereto.

In accordance with an illustrative embodiment of the present disclosure, the semiconductor layer may include a metal oxide, but is not limited thereto.

In accordance with an illustrative embodiment of the present disclosure, the semiconductor layer may include an oxide of a metal selected from the group consisting of titanium, tin, zinc, tungsten, zirconium, gallium, indium, yttrium, niobium, tantalum, vanadium, and combinations thereof, but is not limited thereto.

In accordance with an illustrative embodiment of the present disclosure, the semiconductor layer may include a metal oxide selected from the group consisting of $TiO_2$, $SnO_2$, ZnO, $WO_3$, $Nb_2O_5$, $TiSrO_3$, and combinations thereof, but is not limited thereto. For example, anatase-type $TiO_2$ may be used as the semiconductor layer, but is not limited thereto. The material that can be used for formation of the semiconductor layer in the dye-sensitized solar cell of the present disclosure may not be limited to the above-enumerated metal oxides. In addition, one type of a metal oxide or a mixture of two (2) or more metal oxides may be used as the semiconductor layer, but is not limited thereto.

For example, the semiconductor layer may include semiconductor fine particles, but is not limited thereto. Improvement of the efficiency of the dye-sensitized solar cell may be promoted by increasing a surface area of the semiconductor fine particles so as to enable the dye adsorbed to the semiconductor layer to absorb much more light, but is not limited thereto. For example, in order to increase the surface area, the semiconductor fine particles may have an average particle diameter of about 50 nm or less, and for example, an average particle diameter of from about 5 nm to about 15 nm, from about 5 nm to about 25 nm, from about 5 nm to about 35 nm, from about 5 nm to about 50 nm, from about 15 nm to about 25 nm, from about 15 nm to about 35 nm, from about 15 nm to about 50 nm, from about 25 nm to about 35 nm, from about 25 nm to about 50 nm, or from about 35 nm to about 50 nm, but not be limited thereto. The average particle diameter of the semiconductor fine particles may be properly from about 15 nm to about 25 nm, but is not limited thereto.

In accordance with an illustrative embodiment of the present disclosure, the semiconductor layer may have a thickness of about 3.0 μm or less, but is not limited thereto. For example, the semiconductor layer may have a thickness of from about 0.5 μm to about 1.0 μm, from about 0.5 μm to about 1.5 μm, from about 0.5 μm to about 2.0 μm, from about 0.5 μm to about 2.5 μm, from about 0.5 μm to about 3.0 μm, from about 1.0 μm to about 1.5 μm, from about 1.0 μm to about 2.0 μm, from about 1.0 μm to about 2.5 μm, from about 1.0 μm to about 3.0 μm, from about 1.5 μm to about 2.0 μm, from about 1.5 μm to about 2.5 μm, from about 1.5 μm to about 3.0 μm, from about 2.0 μm to about 2.5 μm, from about 2.0 μm to about 3.0 μm, or from about 2.5 μm to about 3.0 μm, but is not limited thereto. For example, the dye-sensitized solar cell of the first aspect of the present disclosure may have high energy conversion efficiency even when the thickness of the semiconductor layer is about 2.0 μm or less or about 1.0 μm or less, but is not limited thereto. For example, with reference to Examples of the present disclosure and FIG. 2C, the dye-sensitized solar cell of the first aspect of the present disclosure may exhibit high energy conversion efficiency (n) of about 9.7% even when the semiconductor layer has a thin thickness of about 0.6 μm, but is not limited thereto.

Unlike the conventional dye-sensitized solar cell, since the dye-sensitized solar cell of the first aspect of the present disclosure uses a dye having a perovskite structure, and not the ruthenium metal complex, as a photosensitizer, and includes a hole transport layer, and not the liquid electrolyte, it may exhibit high energy conversion efficiency even when the thickness of the semiconductor layer is about 3.0 μm or less, about 2.0 μm or less, or about 1.0 μm or less, which is significantly thin compared to the thickness of the semiconductor layer included in the conventional dye-sensitized solar cell. As a result, the dye-sensitized solar cell of the first aspect of the present disclosure is not limited to a certain level of energy conversion efficiency that can be obtained only when the thickness of about 10 μm is secured. However, the present disclosure is not limited thereto. Further, the dye-sensitized solar cell of the present disclosure may reduce the costs for production of the dye-sensitized solar cell by making the semiconductor layer having a thin thickness, and the dye-sensitized solar cell may be produced in a flexible device form. However, the present disclosure is not limited thereto.

The dye included in the dye-sensitized solar cell of the first aspect of the present disclosure may be represented by the following Chemical Formula 1.

$$RMX_3,$$ [Chemical Formula 1]

in the Chemical Formula 1, R is an alkyl group of $C_{1-20}$, an alkyl group substituted with an amine group, or an alkali metal, M is a member selected from the group consisting of Pb, Sn, Ti, Nb, Zr, and Ce, and X is halogen.

For example, the dye represented by Chemical Formula 1 above may be produced from $MX_2$ and RX, but is not limited thereto. The dye represented by Chemical Formula 1 above is an organic-inorganic composite material having a $RMX_3$ structure, and in Chemical Formula 1 above, R is an alkyl group of $C_{1-20}$, an alkyl group substituted with an amine group, or an alkali metal, M is Pb, Sn, Ti, Nb, Zr, and Ce, and X is halogen. The alkyl group may have 1 to 20 carbons, but is not limited thereto. For example, the number of carbons may be from about 1 to about 20, from about 1 to about 10, from about 1 to about 6, from about 6 to about 20, from about 6 to about 10, or from about 10 to about 20, but not be limited thereto. The halogen may be F, Br, Cl, or I, but is not limited thereto. The dye represented by Chemical Formula 1 above may be $CH_3NH_3PbI_3$, but is not limited thereto. Since the dye represented by Chemical Formula 1 above has a high light absorbance coefficient in an exponential unit, compared to a general organic dye, it exhibits a highly superior light harvesting effect even in case of a thin film, and accordingly, if the dye represented by Chemical Formula 1 above is used, even though the dye-sensitized solar cell has a thin light absorption layer, high energy conversion efficiency can be achieved, but is not limited thereto.

In accordance with an illustrative embodiment of the present disclosure, the dye may have a perovskite structure, but is not limited thereto.

In accordance with an illustrative embodiment of the present disclosure, the dye may have a concentration of from about 30 wt % to about 50 wt %, but is not limited thereto. For example, the dye may have a concentration of from about 30 wt % to about 35 wt %, from about 30 wt % to about 40 wt %, from about 30 wt % to about 45 wt %, from about 30 wt % to about 50 wt %, from about 35 wt % to about 40 wt %, from about 35 wt % to about 45 wt %, from about 35 wt % to about 50 wt %, from about 40 wt % to about 45 wt %, from about 40 wt % to about 50 wt %, or from about 45 wt % to about 50 wt %, but is not limited thereto. For example, if the concentration of the dye is less than about 30 wt %, there may be a problem in that the light absorption is not significant, and if the concentration of the dye exceeds about 50 wt %, there may be a problem in that the dye is not dissolved in a solvent. However, the present disclosure is not limited thereto.

In accordance with an illustrative embodiment of the present disclosure, the hole transport layer may include a unimolecular or polymeric hole transport material, but is not limited thereto. For example, spiro-MeOTAD (2,2',7'-tetra-kis-(N,N-di-p-methoxyphenyl-amine)-9,9' spirobifluorene) may be used as the unimolecular hole transport material, and P3HT [poly(3-hexylthiophene)] may be used as the polymer transport material, but is not limited thereto. In addition, for example, the hole transport layer may further include any of Li-based dopants, Co-based dopants, or Li-based dopants and Co-based dopants as a dopant material, but is not limited thereto. In addition, for example, the hole transport layer may further include an additive such as tBP, but is not limited thereto. For example, a mixture of spiro-MeOTAD, 4-tert-butylpyridine (tBP), and lithium bis(trifluoromethyl-sulfonyl)imide (Li-TFSI) may be used as a material for the hole transport layer, but is not limited thereto. For example, if a p-type hole transport material is used, hole mobility is about $10^4$ greater than that of spiro-MeOTAD, and thus, hole transportation can be effectively carried out even in case of a thick film, but is not limited thereto.

In this regard, the conventional dye-sensitized solar cell has been generally produced by using liquid electrolyte, but in such case, a solvent included in the liquid electrolyte may be leaked or volatilized depending on increase of an external temperature and the sealing state of the solar cell, and thereby, the life time of the solar cell is reduced. Thus, the dye-sensitized solar cell of the present disclosure includes the hole transport layer, instead of using the liquid electrolyte, so that the dye-sensitized solar cell of the present disclosure has overcome a variety of drawbacks, such as described above, and has long-term stability, but the present disclosure is not limited thereto. In addition, the organic-inorganic composite dye included as a dye in the dye-sensitized solar cell of the present disclosure and having the perovskite structure of Chemical Formula 1 above has, under some circumstances, low stability in common liquid electrolyte; however, the present disclosure forms the hole transport layer including the hole transport material, which is a unimolecular material, instead of the liquid electrolyte. In this regard, the Examples of the present disclosure, which will be provided later, describe "Examples" for the dye-sensitized solar cell including the hole transport layer in accordance with the first aspect of the present disclosure and a "Comparative Example" for the dye-sensitized solar cell including the liquid electrolyte, instead of the hole transport layer, in order to compare the energy conversion efficiency and others for both the cases.

Since the hole transport material included in the hole transport layer has a short hole movement characteristic, its application is not suitable when a thickness of the light absorption layer included in the dye-sensitized solar cell is thick. Since a conventional light absorption layer including a ruthenium metal complex as a dye cannot improve the energy conversion efficiency due to reduction of current density when a thickness of the light absorption layer is thin, there has been difficulty in combining the light absorption layer with the hole transport layer. However, since the dye-sensitized solar cell of the present disclosure uses the light absorption layer including the organic-inorganic composite dye having the perovskite structure, instead of the ruthenium metal complex, and the dye has a high light absorption coefficient, it is possible to secure high current density and high energy conversion efficiency even when the thickness of the light absorption layer is thin. And the light absorption layer is suitable for combination with the hole transport layer. Accordingly, the dye-sensitized solar cell having the organic-inorganic composite dye having the perovskite structure and the hole transport layer in the present disclosure includes the light absorption layer having a thin thickness and can secure high efficiency and long stability, but the present disclosure is not limited thereto.

In accordance with an illustrative embodiment of the present disclosure, the second electrode may include a member selected from the group consisting of Pt, Au, Ni, Cu, Ag, In, Ru, Pd, Rh, Ir, Os, C, a conductive polymer, and combinations thereof, but is not limited thereto. For example, the long-term stability of the dye-sensitized solar cell of the present disclosure can be improved by using Au, which is a metal having high stability, but is not limited thereto. For the second electrode, i.e., the counter electrode, any conductive material may be used without limitation, and any insulating material may be used if a conductive layer is formed on only a part of the insulating material, which faces the first electrode, but is not limited thereto. For example, if a conductive layer is formed on one surface of a glass or plastic substrate containing a material selected from the group consisting of indium tin oxides (ITO), fluorine tin oxides (FTO), $ZnO-Ga_2O_3$, $ZnO-Al_2O_3$, tin-based oxides, zinc oxides, and combinations thereof, i.e., a transparent conductive substrate, such that the conductive layer faces the first electrode, the substrate may be used as the second electrode, but is not limited thereto. Here, the conductive layer may include a member selected from the group consisting of Pt, Au, Ni, Cu, Ag, In, Ru, Pd, Rh, Ir, Os, C, a conductive polymer, and combinations thereof, but is not limited thereto. For example, as a method for forming the conductive layer on the other surface of the transparent conductive substrate, physical vapor deposition (PVD) methods such as electroplating, sputtering, and electron beam deposition may be used, but is not limited thereto.

In a second aspect of the present disclosure provides a producing method of the dye-sensitized solar cell according to the first aspect of the present disclosure, which comprises: forming a semiconductor layer on a first electrode including a transparent conductive substrate; adsorbing a dye represented by the following Chemical Formula 1 to the semiconductor layer, following by heat treatment to form a light absorption layer; forming a hole transport layer on the light absorption layer; and forming a second electrode on the hole transport layer:

$$RMX_3,\qquad\text{[Chemical Formula 1]}$$

in the Chemical Formula 1, R is an alkyl group of $C_{1-20}$, an alkyl group substituted with an amine group, or an alkali metal, M is a member selected from the group consisting of Pb, Sn, Ti, Nb, Zr, and Ce, and X is halogen.

Since the second aspect of the present disclosure relates to a method for producing the dye-sensitized solar cell in accordance with the first aspect of the present disclosure, detailed descriptions of the method for producing the dye-sensitized solar cell, which overlap with those of the first aspect of the present disclosure, are omitted hereinafter, but the descriptions of the first aspect of the present disclosure may be identically applied to the second aspect of the present disclosure, even though they are omitted hereinafter.

Meanwhile, since a common method for producing a dye-sensitized solar cell is well known in the art of the present disclosure, and can be clearly understood by those skilled in the art, detailed descriptions of the method are omitted hereinafter. However, the process for forming the light absorption layer, which may include the distinguishable characteristics of the second aspect of the present disclosure, is described in detail hereinafter.

Here, as in the first aspect of the present disclosure, the light absorption layer may include the semiconductor layer and the dye represented by the following Chemical Formula 1, in Chemical Formula 1, R is an alkyl group of $C_{1-20}$, an alkyl group substituted with an amine group, or an alkali metal, M is a member selected from the group consisting of Pb, Sn, Ti, Nb, Zr, and Ce, and X is halogen.

$$RMX_3.\qquad\text{[Chemical Formula 1]}$$

In accordance with an illustrative embodiment of the present disclosure, the semiconductor layer may include a metal oxide selected from the group consisting of $TiO_2$, $SnO_2$, ZnO, $WO_3$, $Nb_2O_5$, $TiSrO_3$, and combinations thereof, but is not limited thereto.

In order to form the light absorption layer, a semiconductor layer may be first formed on the other surface of the transparent conductive substrate of the first electrode including the transparent conductive substrate. Forming the semiconductor layer may be carried out, for example, by coating paste containing semiconductor fine particles on the other surface of the transparent conductive substrate and carrying out heat treatment therefor, but is not limited thereto. Here, the heat treatment may be carried out at from about 400° C. to about 600° C. for about 30 minutes if a binder has been added, or at about 200° C. or less if no binder has been added, but may not be limited thereto.

In accordance with an illustrative embodiment of the present disclosure, the semiconductor layer may be formed on the first electrode by a doctor blade method, a screen printing method, a spin coating method, or a spraying method, but the present disclosure is not limited thereto. Depending on the method selected to form the semiconductor layer on the first electrode, a physical property may vary that is required for the paste containing the semiconductor fine particles used as a raw material for forming the semiconductor layer. The method that can be used to form the semiconductor layer on the first electrode is not limited to the above-enumerated methods, and other common wet coating methods or others may be applied.

In accordance with an illustrative embodiment of the present disclosure, the semiconductor layer may have a thickness of about 3.0 μm or less, but is not limited thereto. For example, the semiconductor layer may have a thickness of from about 0.5 μm to about 1.0 μm, from about 0.5 μm to about 1.5 μm, from about 0.5 μm to about 2.0 μm, from about 0.5 μm to about 2.5 μm, from about 0.5 μm to about 3.0 μm, from about 1.0 μm to about 1.5 μm, from about 1.0 μm to about 2.0 μm, from about 1.0 μm to about 2.5 μm, from about 1.0 μm to about 3.0 μm, from about 1.5 μm to about 2.0 μm, from about 1.5 μm to about 2.5 μm, from about 1.5 μm to about 3.0 μm, from about 2.0 μm to about 2.5 μm, from about 2.0 μm to about 3.0 μm, or from about 2.5 μm to about 3.0 μm, but is not limited thereto. For example, the dye-sensitized solar cell produced in accordance with the second aspect of the present disclosure may have high energy conversion efficiency even when the thickness of the semiconductor layer is about 2.0 μm or less, or about 1.0 μm or less, but the present disclosure is not limited thereto. For example, with reference to the Examples of the present disclosure and FIG. 2C, the dye-sensitized solar cell of the first aspect of the present disclosure may exhibit high energy conversion efficiency (η) of about 9.7% even when the semiconductor layer has a thin thickness of about 0.6 μm, but is not limited thereto.

In accordance with an illustrative embodiment of the present disclosure, the semiconductor layer may have a porous structure, but is not limited thereto.

In accordance with an illustrative embodiment of the present disclosure, the producing method of the dye-sensitized solar cell may further comprising coating a polymer on the semiconductor layer followed by heat treatment, but is not limited thereto. By coating the polymer on the semiconductor layer followed by heat treatment, the porosity of the semiconductor layer may be further improved, but is not limited thereto. In addition, by coating the polymer on the semiconductor layer, improvement of dispersibility of the semiconductor fine particles included in the semiconductor layer, improvement of a film formation property thanks to increase of viscosity, improvement of the force of adhesion between the substrate and the semiconductor layer can be expected, but is not limited thereto. Here, a temperature for the heat treatment may be from about 400° C. to about 500° C., from about 400° C. to about 600° C., or from about 500° C. to about 600° C., but is not limited thereto.

In accordance with an illustrative embodiment of the present disclosure, the polymer may include a member selected from the group consisting of ethylenecellulose (EC), hydroxypropylcellulose (HPC), polyethyleneglycol (PEG), polyethyleneoxide (PEO), polyvinylalcohol (PVA), polyvinylpyrrolidone (PVP), and combinations thereof, but is not limited thereto. The polymer to be applied on the semiconductor layer is not limited to the above-enumerated polymers, and various polymers having no residual organic material after heat treatment may be selected and used. When selecting the polymer, it may be preferable to select a polymer having a proper molecular weight in consideration of an applying condition including an applying method, but is not limited thereto.

After the semiconductor layer is formed on the first electrode including the transparent conductive substrate according to the above-described method, adsorbing the dye represented by the following Chemical Formula 1 to the semiconductor layer, followed by heat treatment to form a light absorption layer. In the Chemical Formula 1, R is an alkyl group of $C_{1-20}$, an alkyl group substituted with an amine group, or an alkali metal, M is a member selected from the group consisting of Pb, Sn, Ti, Nb, Zr, and Ce, and X is halogen.

$$RMX_3. \qquad \text{[Chemical Formula 1]}$$

In accordance with an illustrative embodiment of the present disclosure, the dye may have the perovskite structure, but is not limited thereto.

In accordance with an illustrative embodiment of the present disclosure, the dye may have a concentration of from about 30 wt % to about 50 wt %, but is not limited thereto. For example, the dye may have a concentration of from about 30 wt % to about 35 wt %, from about 30 wt % to about 40 wt %, from about 30 wt % to about 45 wt %, from about 30 wt % to about 50 wt %, from about 35 wt % to about 40 wt %, from about 35 wt % to about 45 wt %, from about 35 wt % to about 50 wt %, from about 40 wt % to about 45 wt %, from about 40 wt % to about 50 wt %, or from about 45 wt % to about 50 wt %, but is not limited thereto.

For example, adsorbing the dye to the semiconductor layer in order to form the light absorption layer may be carried out by using a method of spraying, coating, or immersing a dispersion solution containing the dye, but is not limited thereto. For example, it may be preferable to carry out adsorbing the dye by using a spin coating, deep coating, screen coating, spray coating, electric radiation method or others for from about 10 seconds to about 5 minutes, but is not limited thereto. For example, time for adsorbing the dye may be from about 10 seconds to about 30 seconds, from about 10 seconds to about 1 minute, from about 10 seconds to about 2 minutes, from about 10 seconds to about 3 minutes, from about 10 seconds to about 4 minutes, from about 10 seconds to about 5 minutes, from about 30 seconds to about 1 minute, from about 30 seconds to about 2 minutes, from about 30 seconds to about 3 minutes, from about 30 seconds to about 4 minutes, from about 30 seconds to about 5 minutes, from about 1 minute to about 2 minutes, from about 1 minute to about 3 minutes, from about 1 minute to about 4 minutes, from about 1 minute to about 5 minutes, from about 2 minutes to about 3 minutes, from about 2 minutes to about 4 minutes, from about 2 minutes to about 5 minutes, from about 3 minutes to about 4 minutes, from about 3 minutes to about 5 minutes, or from about 4 minutes to about 5 minutes, but not be limited thereto. If the time for adsorbing the dye is less than about 10 seconds, there may be a problem in the dispersibility, and if the time exceeds about 5 minutes, there may be a problem in the perovskite particle size of the dye. However, the present disclosure is not limited thereto.

In this regard, the organic dye, which has been conventionally generally used and contains ruthenium metal, takes at least about 2 hours up to about 24 hours for the dye to be adsorbed to the semiconductor layer, and thereby, lengthening the time required for the production process. On the other hand, in case of producing the dye-sensitized solar cell containing the organic-inorganic composite dye having the perovskite structure in accordance with the second aspect of the present disclosure, the time required for the dye adsorption can be significantly reduced, compared to the case of using the organic dye containing the ruthenium metal. This may be because electron movement by physical contact between the organic-inorganic composite dye having the perovskite structure and the surface of the semiconductor layer as used in the present disclosure is possible.

For example, the dispersion solution containing the dye that can be used to adsorb the dye to the semiconductor layer may be produced by using a proper solvent, and for the solvent, a solvent, in which the organic-inorganic composite dye having the perovskite structure in the present disclosure is dissolved, may be used, but the solvent is not specifically limited. For example, for the solvent, γ-butyrolactone or dimethyl formamide (DMF) may be used, but the solvent is not limited thereto.

According to the above-described method, after the semiconductor layer is formed on the first electrode including the transparent conductive substrate, and the dye represented by the following Chemical Formula 1 is adsorbed to the semiconductor layer, heat treatment may be carried out to complete the light absorption layer. In this case, the heat treatment may be carried out at from about 40° C. to about 300° C., and more preferably, at a temperature of from about 50° C. to about 200° C., or from about 70° C. to about 120° C., but is not limited thereto. For example, if the heat treatment is carried out at a temperature of less than about 40° C., photocurrent may be reduced, and if the heat treatment is carried out at a temperature in excess of about 300° C., the dye may be thermally decomposed. However, the present disclosure is not limited thereto.

In accordance with an illustrative embodiment of the present disclosure, forming the light absorption layer may include coating a precursor solution of the dye represented by the Chemical Formula 1 on the semiconductor layer, followed by the heat treatment therefor at from about 40° C. to about 300° C., but is not limited thereto. For example, the heat treatment may be carried out at from about 40° C. to about 80° C., from about 40° C. to about 120° C., from about 40° C. to about 150° C., from about 40° C. to about 200° C., from about 40° C. to about 250° C., from about 40° C. to about 300° C., from about 80° C. to about 120° C., from about 80° C. to about 150° C., from about 80° C. to about 300° C., from about 80° C. to about 120° C., from about 80° C. to about 150° C., from about 80° C. to about 200° C., from about 80° C. to about 250° C., from about 80° C. to about 300° C., from about 120° C. to about 150° C., from about 120° C. to about 200° C., from about 120° C. to about 250° C., from about 120° C. to about 300° C., from about 150° C. to about 200° C., from about 150° C. to about 250° C., from about 150° C. to about 300° C., from about 200° C. to about 250° C., from about 200° C. to about 300° C., or from about 250° C. to about 300° C., but is not limited thereto. For example, the heat treatment may be generally carried out at a temperature of about 100° C., but is not limited thereto.

After the light absorption layer is formed on the first electrode including the transparent conductive substrate according to the above-described method, the hole transport layer may be formed on the light absorption layer, and subsequently, the second electrode may be formed on the hole transport layer to complete the dye-sensitized solar cell of the present disclosure. If the dye-sensitized solar cell is produced by a stacking method, it may be economically profitable in that the use of a high-priced raw material like FTO or others can be reduced in half, but the present disclosure is not limited thereto.

In accordance with an illustrative embodiment of the present disclosure, the hole transport layer may include a unimolecular or polymeric hole transport material, but is not limited thereto. For example, spiro-MeOTAD may be used as the unimolecular hole transport material, and P3HT may be used as the polymeric hole transport material. However, the present disclosure is not limited thereto. In addition, for example, the hole transport layer may further include any of Li-based dopant, Co-based dopant, or Li-based dopant and Co-based dopant as a doping material, but is not limited thereto. In addition, for example, the hole transport layer may further include an additive like tBP, but is not limited thereto. For example, forming the hole transport layer on the light absorption layer may be carried out by spin-coating the hole transport material, and the hole transport material may include, for example, a mixture of spiro-MeOTAD, tBP, and Li-TFSI, but is not limited thereto.

In accordance with an illustrative embodiment of the present disclosure, the second electrode may include a member selected from the group consisting of Pt, Au, Ni, Cu, Ag, In, Ru, Pd, Rh, Ir, Os, C, a conductive polymer, and combinations thereof, but is not limited thereto.

Hereinafter, the present disclosure are described in more detail by using Examples, but are not limited to the Examples.

EXAMPLES

1. Production of the Dye-Sensitized Solar Cell (1) Production of $CH_3NH_3PbI_3$ Dye In this Example, in order to produce the dye-sensitized solar cell in accordance with the first aspect of the present disclosure, $CH_3NH_3PbI_3$ included in the dye represented by $[RMX_3]$, which is Chemical Formula 1, was produced and used. The process for producing the $CH_3NH_3PbI_3$ dye is described in detail below.

First, after an ice bath was prepared and filled with ice and water, a 250 mL round flask was fixed in the bath such that at least half of the flask was submerged therein. Thereafter, about 27.858 mL of about 0.273 mol methyl amine and about 30 mL of about 0.227 mol HI were put into the 250 mL round flask and stirred for about 2 hours. Thereafter, the solvent was vaporized by using an evaporator at about 50° C. for about 1 hour, and a precipitate obtained was washed with diethyl ether three (3) times. Thereafter, the washed precipitate was moved into a beaker and dried within a vacuum oven of about 60° C. for about 24 hours so that $CH_3NH_3I_3$ was produced.

Thereafter, $CH_3NH_3I$ and $PbI_2$ (the product of Aldrich) were blended with each other at a weight ratio of about 1:1, and then, the mixture was stirred within γ-butyrolactone at about 60° C. for about 6 hours. In this case, there was a difference in the contents of $CH_3NH_3I$ and $PbI_2$ depending on which of the about 10 wt %, about 20 wt %, about 30 wt %, and about 40 wt % concentration of $CH_3NH_3PbI_3$ was prepared, as shown in Table 1 below.

TABLE 1

| $CH_3NH_3PbI_3$ Dye concentration | γ-butyrolactone | $CH_3NH_3I$ | $PbI_2$ |
|---|---|---|---|
| 40 wt % | 10 mL | 1.955 g (0.0123 mol) | 5.728 g (0.0123 mol) |
| 30 wt % | 10 mL | 1.254 g (0.00789 mol) | 3.674 g (0.00789 mol) |
| 20 wt % | 10 mL | 0.731 g (0.00460 mol) | 2.142 g (0.00460 mol) |
| 10 wt % | 10 mL | 0.3242 g (0.00204 mol) | 0.9499 g (0.00204 mol) |

$CH_3NH_3I$ and $PbI_2$ were blended with each other according to the contents described in Table 1 above and stirred within γ-butyrolactone so that $CH_3NH_3PbI_3$ dye in various concentrations was obtained. Thereafter, in order to remove foreign materials or the like, the dye was filtered twice by using a PVDF syringe filter (the product of Whatman) having a width length of about 13 mm, a height length of about 13 mm, and a thickness of about 0.45 μm, so that the $CH_3NH_3PbI_3$ dye was finally produced.

(2) Formation of the Light Absorption Layer on the First Electrode

In order to produce the dye-sensitized solar cell in accordance with the first aspect of the present disclosure, the first electrode including the transparent conductive substrate was first produced, and the light absorption layer including the semiconductor layer and the $CH_3NH_3PbI_3$ dye produced in Item (1) above was formed on the first electrode. The process for producing the first electrode and forming the light absorption layer thereon are described in detail below.

First, a FTO glass (Pilkington, TEC-8, 8 Ω/sq) was washed with ethanol by using ultrasonic waves for 20 minutes. Thereafter, the FTO substrate was coated by using a 0.1 M Ti(IV) bis(ethylacetoacetato)-diisopropoxide (the product of Aldrich)/1-butanol (the product of Aldrich) solution through a spin-coating method, so that the first electrode including the transparent conductive substrate was produced.

Thereafter, in order to form the semiconductor layer on the first electrode, the first electrode was subject to heat treatment at about 500° C. for about 15 minutes, and then, coated with a $TiO_2$ paste by using the doctor-blade method. In this case, a thickness of the $TiO_2$ paste for the coating was adjusted by using a tape. After the coating, the first electrode was subject to heat treatment at about 100° C. for about 15 minutes. Thereafter, an about 0.02 M $TiCl_4$ solution with the $TiO_2$ film sintered through the heat treatment was subject to heat treatment at about 70° C. for about 10 minutes, and then, further subject to heat treatment at about 500° C. for about 30 minutes, so that the FTO glass coated with the $TiO_2$ film as the semiconductor layer was obtained. In this case, the $TiO_2$ film as the semiconductor layer had a porous structure, and $TiO_2$ was additionally formed on the surface of the already formed porous $TiO_2$ film by the $TiCl_4$ solution treatment, so that roughness of the surface, and as a result, surface area, were increased.

Thereafter, in order to complete the light absorption layer by adsorbing the dye on the $TiO_2$ film (as the semiconductor layer) formed on the FTO glass (as the first electrode), the $CH_3NH_3PbI_3$ dye as produced in Item (1) above was dropped in a concentration of about 40 wt % onto the FTO glass coated with the $TiO_2$ film. In this case, the dropping amount was 200 μm per $2.5 \times 2.5$ $cm^2$. Thereafter, the dye was coated on the $TiO_2$ film by the spin-coating method, and in order to vaporize the solvent used in the process, heat treatment was carried out on a hotplate at about 100° C. for about 15 minutes, so that the light absorption layer including the semiconductor layer and the dye was formed on the first electrode.

(3) Production of the Dye-Sensitized Solar Cell Including the Hole Transport Layer (Examples)

In order to produce the dye-sensitized solar cell in accordance with the first aspect of the present disclosure, the hole transport layer was formed on the light absorption layer, and the second electrode was formed on the hole transport layer, after Item (2) above was performed. In this case, the hole transport layer was formed by spin-coating the hole transport material on the light absorption layer, and the hole transport material included about 0.17 M spiro-MeOTAD, about 0.198 M tBP, and about 64 mM Li-TFSI. Here, Li-TFSI was first dissolved in acetonitrile to a concentration of 0.1977 g/mL, and then, added in the solution state. After the hole transport layer was formed by using the hole transport material, gold (Au) was deposited on the hole transport layer to have a thickness of from about 60 nm to about 80 nm to form the second electrode, so that the dye-sensitized solar cell of the present disclosure was completed. In this case, in order to deposit the gold, a pressure of $10^{-6}$ torr or less was used.

(4) Production of the Dye-Sensitized Solar Cell Including the Liquid Electrolyte (Comparative Example)

The dye-sensitized solar cell produced by Item (3) above included the hole transport layer, and corresponds to the dye-sensitized solar cell in accordance with the first aspect of the present disclosure. For comparison, a dye-sensitized solar cell including a liquid electrolyte, instead of the hole transport layer, was also produced as a Comparative Example. The process for producing the dye-sensitized solar cell of the Comparative Example is described in detail below. However, because the process for producing the first electrode and the process for forming the light absorption layer were performed according to Item (2) above, below are descriptions of only processes the formation of the light absorption layer.

In the present Comparative Example, a platinum (Pt) electrode was prepared as the second electrode. To this end, a hole was formed on a glass to inject electrolyte therethrough, the glass was washed with ethanol by using ultrasonic waves for about 20 minutes, and a $H_2PtCl_6 \cdot xH_2O$/2-propanol solution in a concentration of about 7 mM was instilled per unit cell size, and the solvent was vaporized. After the solvent was completely vaporized, heat treatment was carried out at about 400° C. for about 20 minutes so that the second electrode was completed.

Thereafter, the first electrode, on which the light absorption layer was formed, as produced in Item (2), and the second electrode were assembled, and in this case, ionomeric ethylene acid copolymer resin SURLYN (the product of Solaronix) was used as an adhesive. Specifically, SURLYN was positioned between the first and second electrodes, and compressed by using a press having upper and lower plates heated to about 85° C. and about 95° C., respectively, at a pressure of about 2.3 bar for about 14 seconds, so that SURLYN was melted, and the two electrodes were in surface contact with each other. After the surface contact of the two electrodes, the liquid electrolyte was injected through the hole formed on the second electrode. In this case, LiI in a concentration of about 0.9 M, $I_2$ in a concentration of about 0.45 M, tBP in a concentration of about 0.5 M, and urea in a concentration of about 0.05 M were dissolved in ethyl acetate and used as the liquid electrolyte. The liquid electrolyte was injected through the small hole formed on the second electrode of the two sealed electrodes and sealed, so that the dye-sensitized solar cell of the Comparative Example was completed.

2. Characterization of the Dye-Sensitized Solar Cell Including the Hole Transport Layer (Examples)

Experiments for characterization of the dye-sensitized solar cell including the hole transport layer as produced by the method of Item 1-(3) above were conducted, and FIGS. 2A to 2C and FIGS. 3A to 3C provide the results.

Figure 2A:
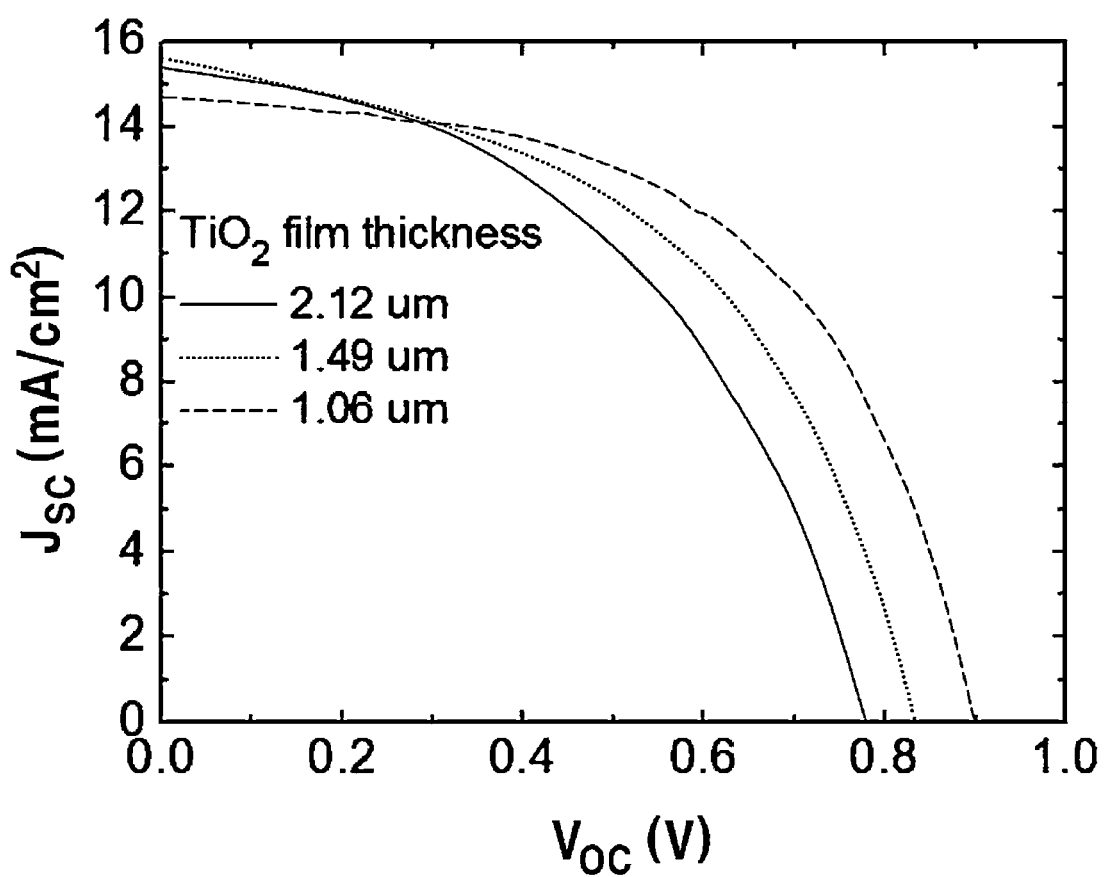
FIGS. 2A through 2C illustrate graphs for a photocurrent-voltage characteristic of the dye-sensitized solar cell produced in accordance with an Example of the present disclosure. Specifically, each of FIG. 2A
Figure 2B:
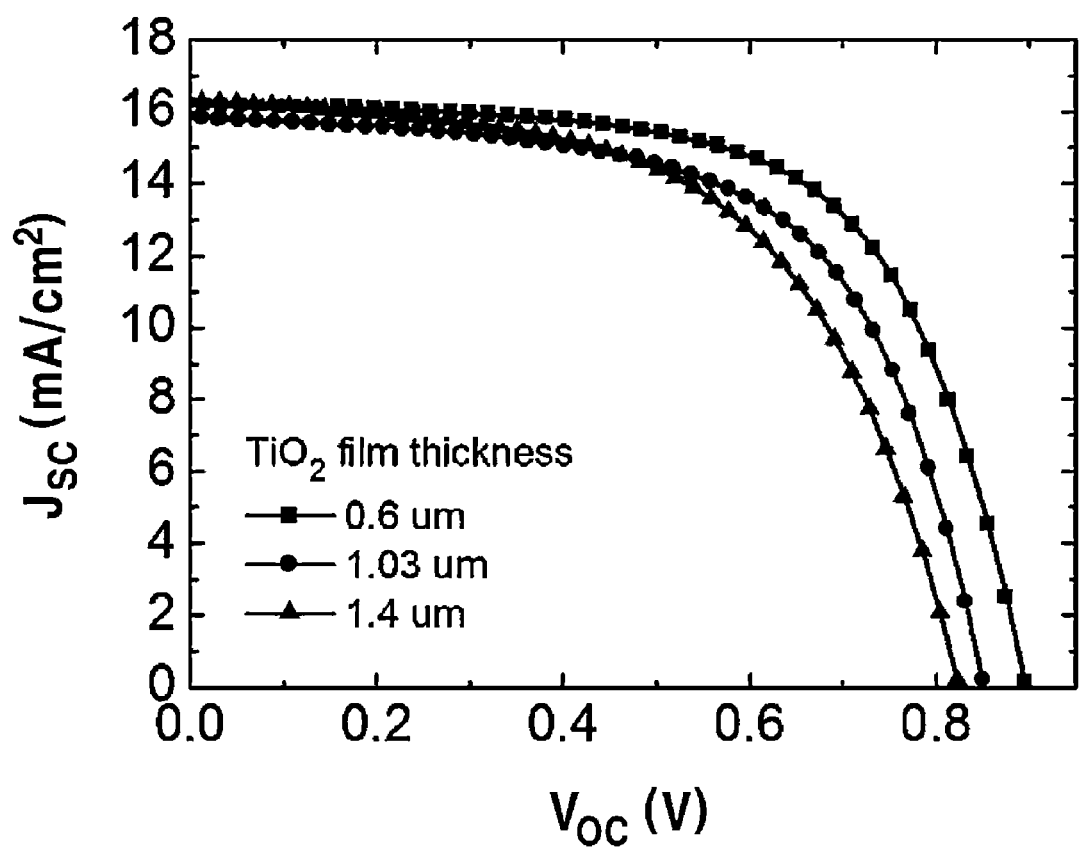
Figure 2C:
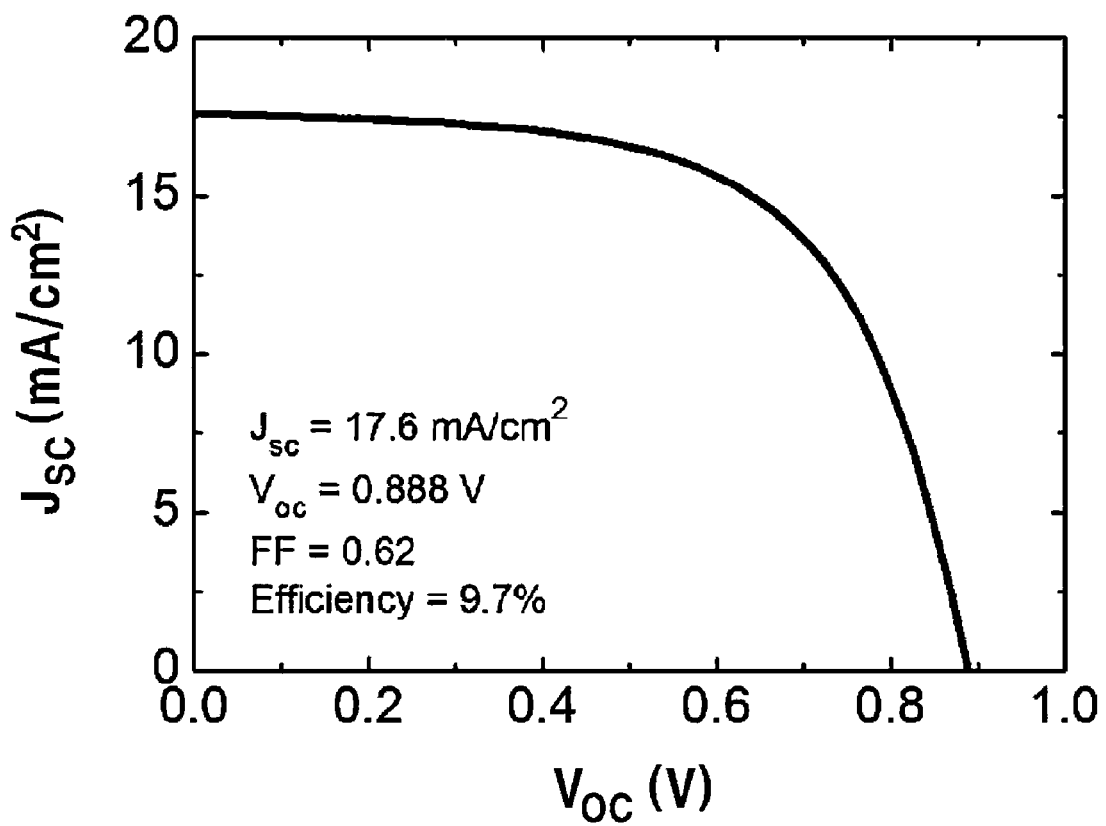

(1) Verification of Energy Conversion Efficiency According to Variation in the Thickness of the Semiconductor Layer (FIGS. 2A to 2C)

In order to verify that the dye-sensitized solar cell in accordance with the first aspect of example embodiments as produced by the method of Item 1-(3) above exhibits high energy conversion efficiency even when the thickness of the semiconductor layer is thin, a photocurrent-voltage characteristic of the dye-sensitized solar cell having the semiconductor layer with various thickness values was measured. In this case, the measurement was performed by using a solar simulator in a standard condition of about AM 1.5 G and 1 sun (100 mW/cm$^2$), and the thickness of the semiconductor was about 2.12 µm, about 1.49 µm, about 1.4 µm, about 1.06 µm, about 1.03 µm, and about 0.6 µm. Table 2 below describes photocurrent density (Jsc), photovoltage (Voc), fill factor (FF), and efficiency (η) according to the thickness of the semiconductor layer.

TABLE 2

| Thickness (µm) | Jsc (mA/cm$^2$) | Voc (V) | FF | η (%) | Area (cm$^2$) |
|---|---|---|---|---|---|
| 2.12 | 15.4 | 0.780 | 0.46 | 5.6 | 0.438 |
| 1.49 | 15.6 | 0.832 | 0.49 | 6.3 | 0.204 |
| 1.4 | 16.3 | 0.825 | 0.57 | 7.7 | 0.216 |
| 1.06 | 14.7 | 0.899 | 0.55 | 7.3 | 0.217 |
| 1.03 | 15.8 | 0.852 | 0.61 | 8.3 | 0.220 |
| 0.6 | 16.2 | 0.897 | 0.64 | 9.3 | 0.207 |

In this regard, FIG. 2A and FIG. 2B are graphs for the photocurrent-voltage characteristic according to variation in the thickness of the semiconductor layer included in the dye-sensitized solar cell including the hole transport layer as produced in accordance with the Examples of the present disclosure, and were prepared based on the photocurrent density (Jsc)-photovoltage (Voc) values described in Table 2 above. Specifically, FIG. 2A is a graph for the photocurrent-voltage characteristic when the thickness of the semiconductor layer is about 2.12 µm, about 1.49 µm, and about 1.06 µm, and FIG. 2B is a graph for the photocurrent-voltage characteristic when the thickness of the semiconductor layer is about 1.4 µm, about 1.03 µm, and about 0.6 µm.

Meanwhile, FIG. 2C is a graph for the photocurrent-voltage characteristic when the highest energy conversion efficiency is exhibited. The measurement condition was the standard condition of about AM 1.5 G and 1 sun, which is the same as described above, while the thickness of the semiconductor layer was about 0.6 µm, which corresponds to the thinnest thickness of the semiconductor layer among the thickness values described in Table 2 above. In this case, the photocurrent density (Jsc) value was about 17.6 mA/cm$^2$, the photovoltage (Voc) value was about 0.888 V, the fill factor (FF) value was about 0.62, and the energy conversion efficiency (n) was recorded with the highest value of about 9.7%. High applicability of the dye-sensitized solar cell in accordance with the first aspect of the present disclosure was verified. Especially, the high energy conversion efficiency (η) of about 9.7% cannot be easily achieved when a liquid electrolyte is used as in the Comparative Example of the present disclosure, and it is estimated that the high energy conversion efficiency could be achieved as a result of the characteristic high current density of the dye-sensitized solar cell including the hole transport layer. In comparison, when the liquid electrolyte is used as in the Comparative Example of the present disclosure, the energy conversion efficiency is merely about 5% (see Table 4 infra), and the high energy conversion efficiency cannot be achieved. This may be related to the fact that high current density is not secured when the liquid electrolyte is used.

In addition, from the graphs of FIG. 2A to FIG. 2C, it was confirmed that the dye-sensitized solar cell in accordance with the first aspect of the present disclosure can achieve high energy conversion efficiency even when the thickness of the semiconductor layer is thin, and exhibits higher energy conversion efficiency when the thickness of the semiconductor layer is thin with about 1 µm or less, than that when the thickness of the semiconductor layer is thick.

Figure 3A:
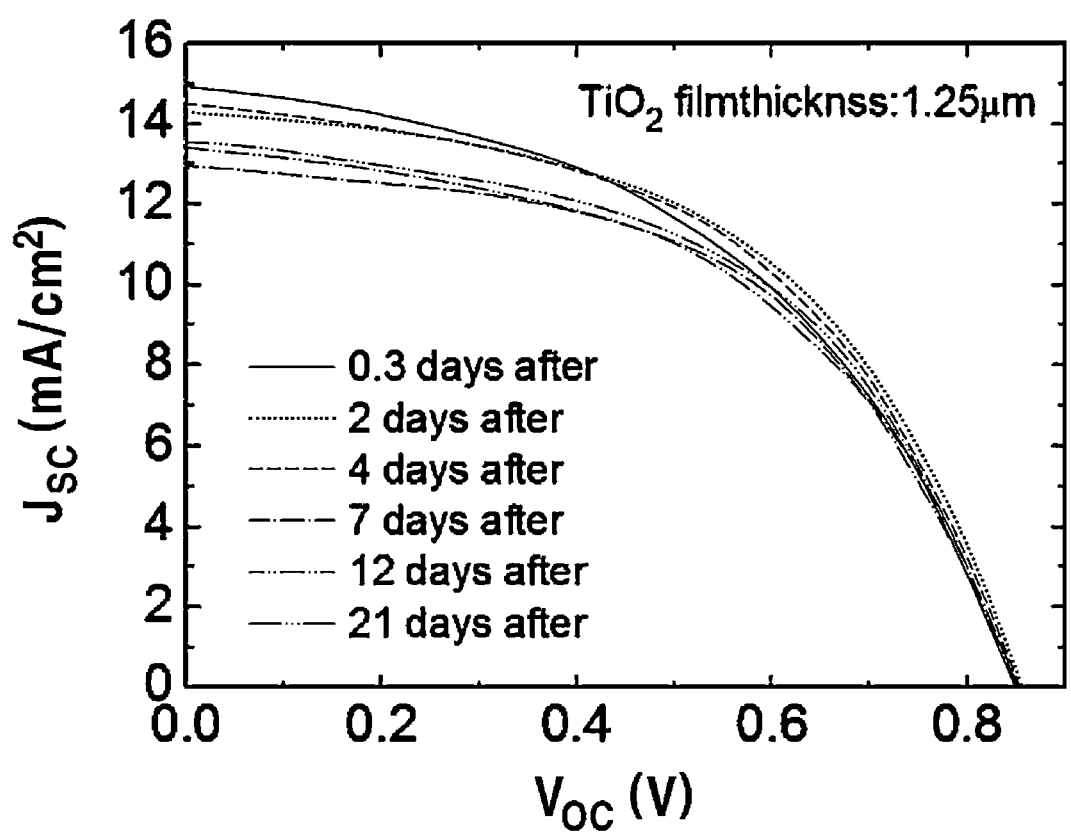
FIG. 3A to FIG. 3C show graphs for long-term stability of the dye-sensitized solar cell produced in accordance with an Example of the present disclosure according to lapse of time.
Figure 3B:
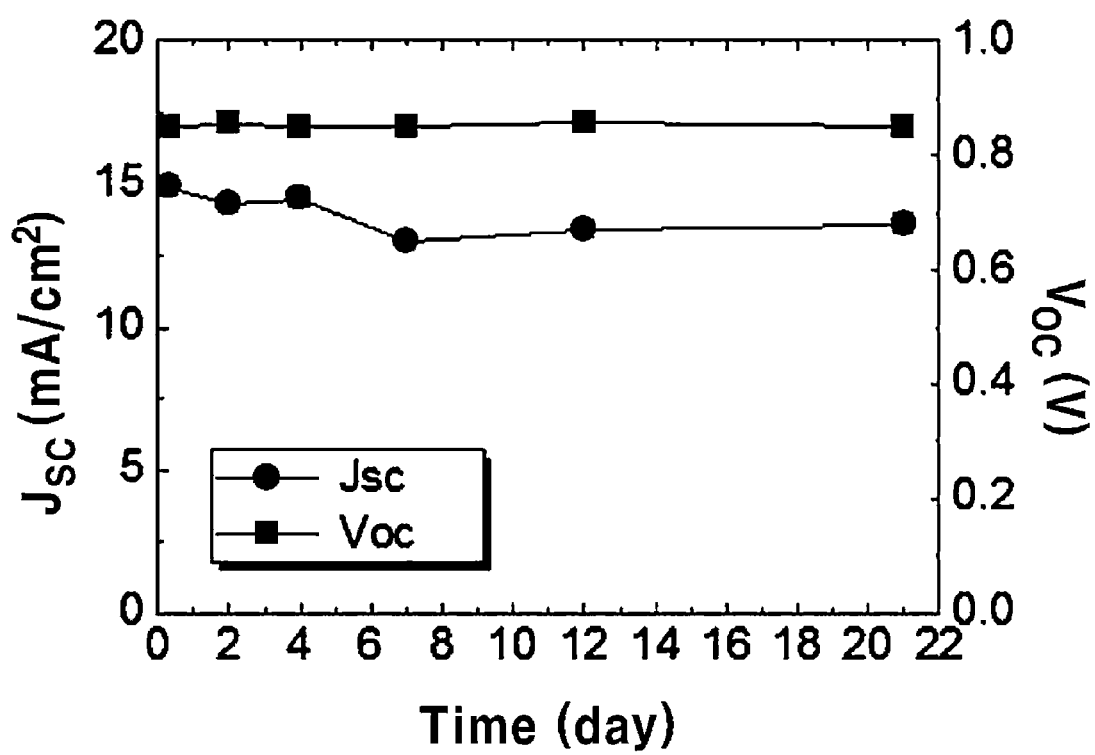
Figure 3C:
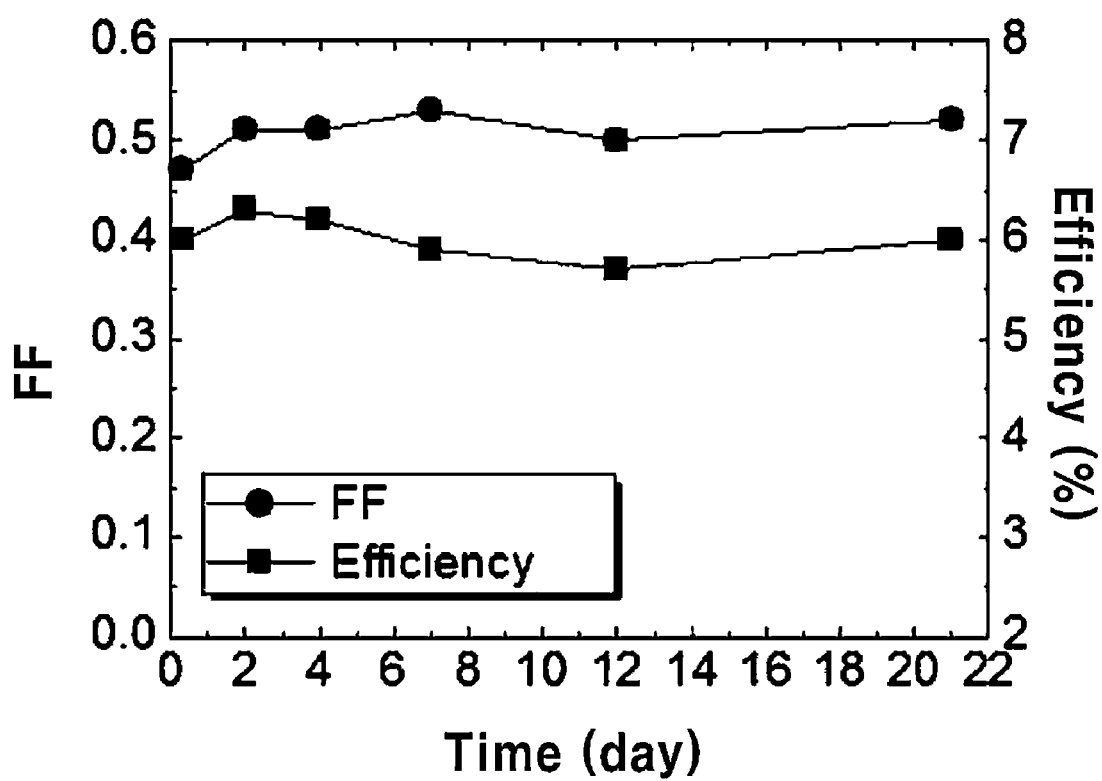

(2) Verification of Long-Term Stability According to Lapse of Time (FIGS. 3A to 3C)

The dye-sensitized solar cell including the liquid electrolyte in the Comparative Example does not achieve high life time due to liquid leakage, volatilization or others problems. Specifically, in case of using the liquid electrolyte, the long-term stability was significantly low. Accordingly, the dye-sensitized solar cell including the hole transport layer as produced by the method of Item 1-(3) above, a photocurrent-voltage characteristic of the dye-sensitized solar cell was measured according to lapse of time to demonstrate long term stability.

In this case, the measurement was conducted by using a solar simulator in a standard condition of about AM 1.5 G and 1 sun (100 mW/cm$^2$), and the thickness of the semiconductor layer was about 1.25 µm. In addition, in order to verify that the characteristic is consistently maintained, i.e., the dye-sensitized solar cell has long-term stability, photocurrent density (Jsc), photovoltage (Voc), fill factor (FF), and efficiency (η) were measured after lapse of 0.3, 2, 4, 7, 12 and 21 days. Table 3 below describes the results.

TABLE 3

| Time (Days) | Jsc (mA/cm$^2$) | Voc (V) | FF | η (%) |
|---|---|---|---|---|
| 0.3 | 14.9 | 0.849 | 0.47 | 6.0 |
| 2 | 14.3 | 0.856 | 0.51 | 6.3 |
| 4 | 14.5 | 0.851 | 0.51 | 6.2 |
| 7 | 13.0 | 0.849 | 0.53 | 5.9 |
| 12 | 13.4 | 0.858 | 0.50 | 5.7 |
| 21 | 13.6 | 0.849 | 0.52 | 6.0 |

In this regard, FIG. 3A to FIG. 3C are graphs for long-term stability of the dye-sensitized solar cell produced in accordance with an Examples of the present disclosure according to lapse of time, and were prepared based on the data described in Table 3 above. Through Table 3 above, and FIG. 3A to FIG. 3C, it was verified that the dye-sensitized solar cell including the hole transport layer, instead of the liquid electrolyte, in accordance with the first aspect of the present disclosure has long-term stability of at least about 500 hours. However, the long-term stability of the dye-sensitized solar cell is affected by the material for the second electrode, which acts as a counter electrode. In case of using silver (Ag), which is highly reactive so as to be easily corroded, as the second electrode, it is difficult to assure the long-term stability because the efficiency may be reduced to about 50% after a lapse of about 7 days. Accordingly, in order to assure the high long-term stability, it may be helpful to use a stable material like gold (Au).

3. Characterization of the Dye-Sensitized Solar Cell Including the Liquid Electrolyte [Comparative Example]

Experiments for characterization of the dye-sensitized solar cell including the liquid electrolyte as produced by the method of Item 1-(4) above, and FIGS. 4A, 4B, 5 and 6 describe the results.

Figure 4A:
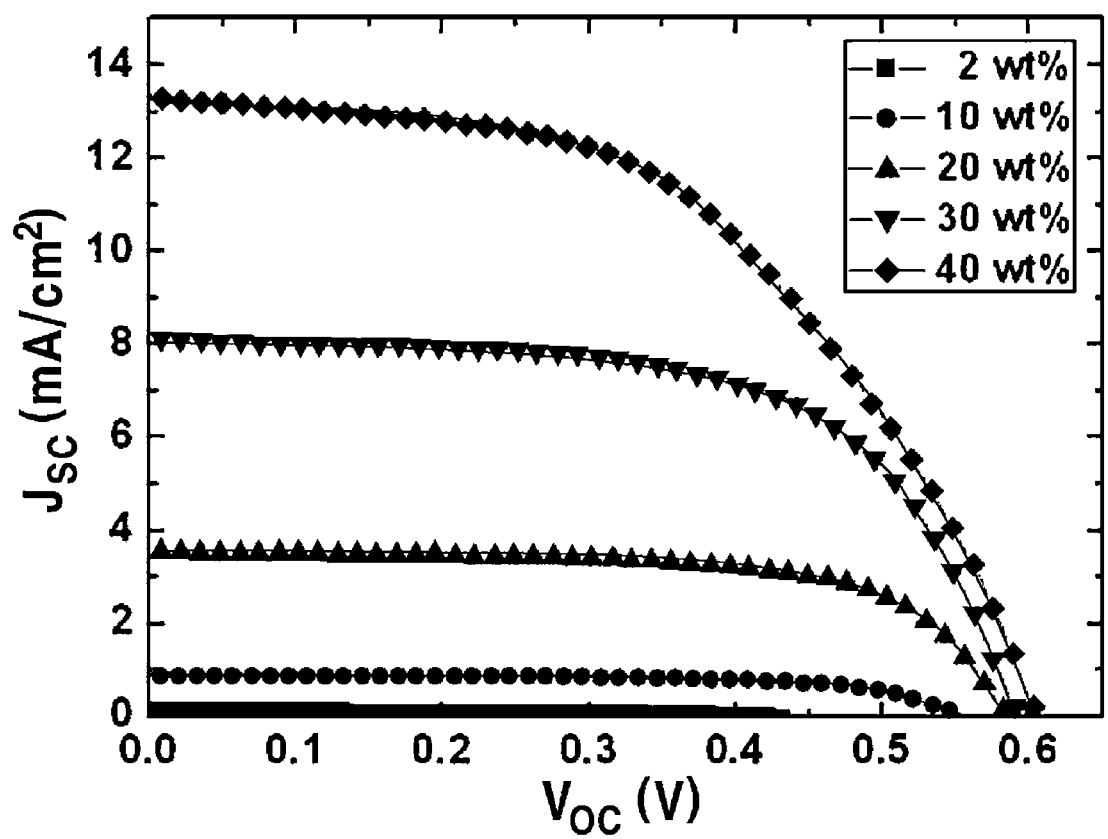
FIG. 4A is a photocurrent-voltage characteristic graph according to variation in a dye concentration of a dye-sensitized solar cell produced in accordance with a Comparative Example of the present disclosure.
Figure 4B:
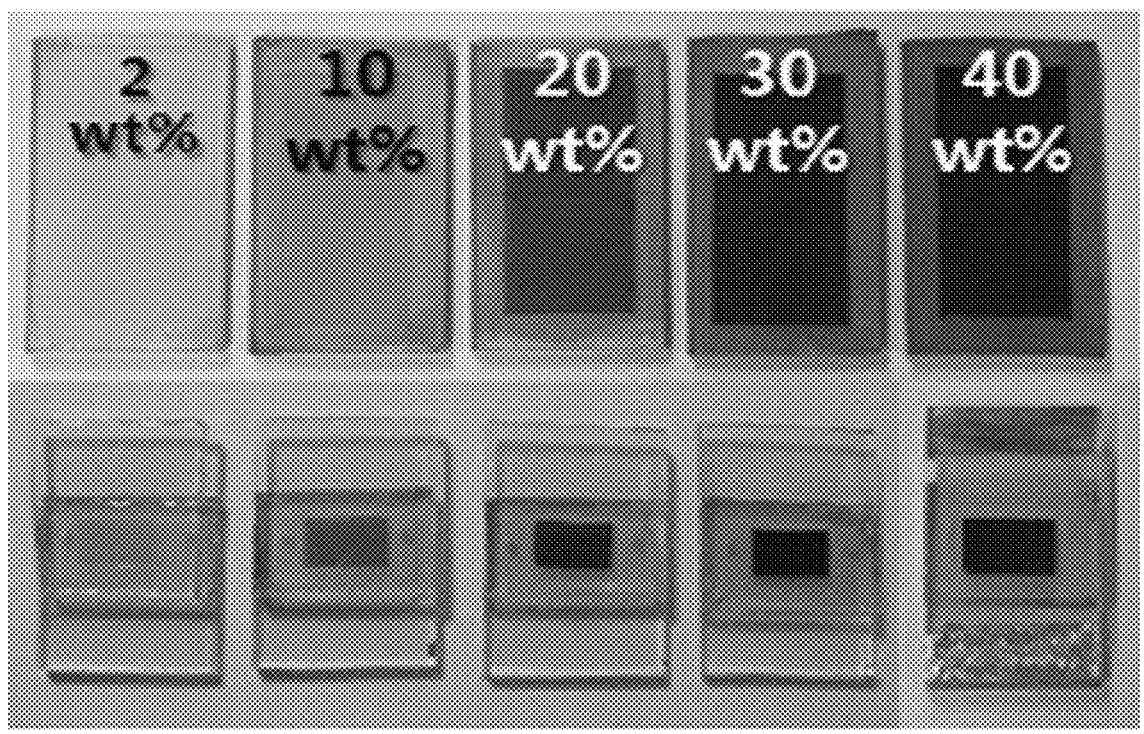
FIG. 4B is a photograph showing change of color of a coating film according to variation in a dye concentration of the dye-sensitized solar cell produced in accordance with a Comparative Example of the present disclosure.

(1) Verification of Energy Conversion Efficiency According to a Dye Concentration (FIGS. 4A and 4B)

Experiments for identifying a dye concentration were conducted by measuring the photocurrent-voltage characteristic of the dye-sensitized solar cell produced by the method of Item 1-(4) above, except for a concentration of the dye included in the dye-sensitized solar cell, and Table 4 below and FIGS. 4A and 4B describe the measurement results. In this case, the measurement of the photocurrent-voltage characteristic was conducted by using a solar simulator in a standard condition of about AM 1.5 G and 1 sun (100 mW/cm$^2$).

TABLE 4

| Concentration | Jsc (mA/cm$^2$) | Voc (V) | FF | η(%) | TiO$_2$ thickness (μm) |
|---|---|---|---|---|---|
| 2 wt % | 0.121 | 0.4246 | 0.579 | 0.03 | 5.3 |
| 10 wt % | 0.880 | 0.5482 | 0.672 | 0.32 | 5.5 |
| 20 wt % | 3.534 | 0.5843 | 0.667 | 1.38 | 5.4 |
| 30 wt % | 8.115 | 0.5912 | 0.616 | 2.96 | 5.4 |
| 40 wt % | 13.31 | 0.6046 | 0.513 | 4.13 | 5.3 |

In this regard, FIG. 4A is a graph for the photocurrent-voltage characteristic of the dye-sensitized solar cell produced in accordance with the Comparative Example of the present disclosure, according to variation in the concentration of the dye, and was prepared by using the data of Table 4 above. With reference to Table 4 above and FIG. 4A, it was confirmed that the highest energy conversion efficiency is achieved when the dye concentration is about 40 wt %.

Meanwhile, FIG. 4B is a photograph showing change in color of the coating film in the dye-sensitized solar cell produced in accordance with the Comparative Example of the present disclosure according to variation in the concentration of the dye. It was identified that as the dye concentration increases, the yellow color gradually changes into black. This result reflects band gap change resulting from the size effect according to the variation in the dye concentration, and the change into the black color as the dye concentration increases means that a wavelength of light to be absorbed is expanded from a short wavelength to a long wavelength.

Figure 5:
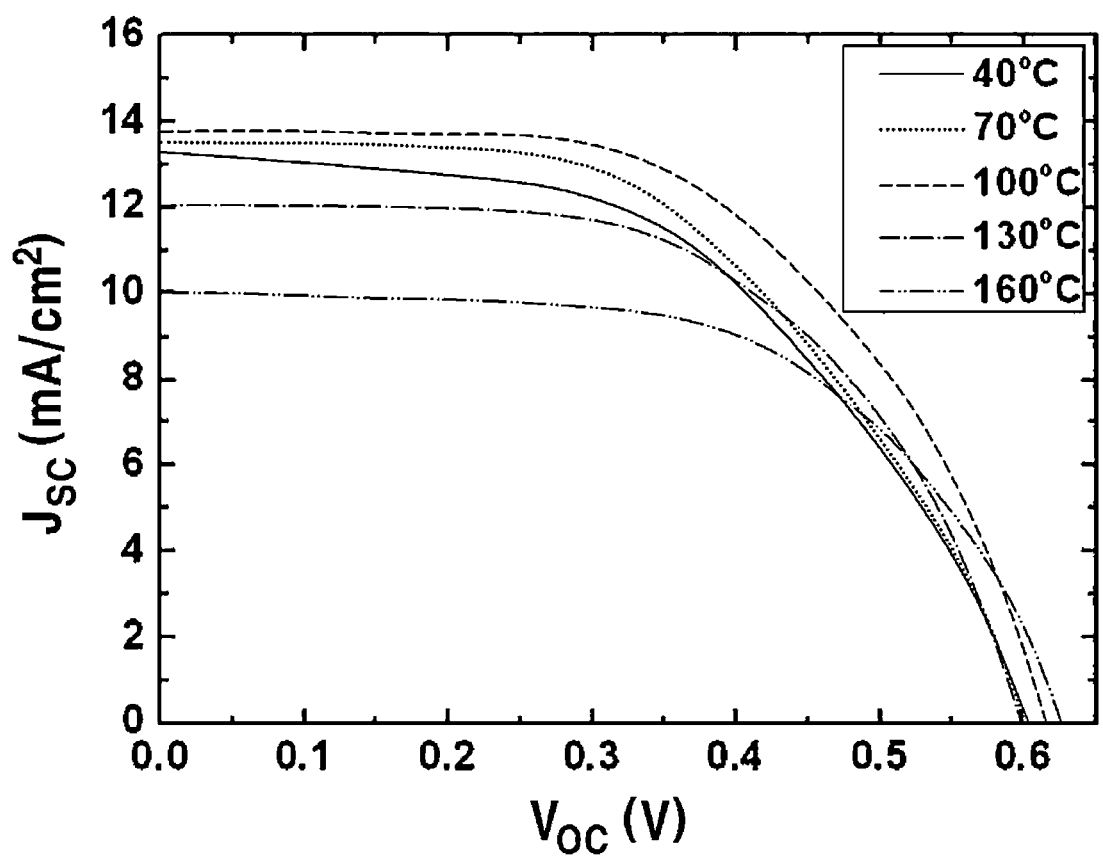
FIG. 5 is a photocurrent-voltage characteristic graph according to variation in a temperature for heat treatment of the dye-sensitized solar cell produced in accordance with a Comparative Example of the present disclosure.

(2) Verification of Energy Conversion Efficiency According to a Temperature for the Heat Treatment (FIG. 5)

Experiments for identifying a temperature for heat treatment were conducted, by measuring the photocurrent-voltage characteristic of the dye-sensitized solar cell produced by the method of Item 1-(4) above, except for a temperature for the heat treatment carried out after the adsorption of the dye to the semiconductor layer when forming the light absorption layer. Table 5 below and FIG. 5 describe the measurement results. In this case, the measurement of the photocurrent-voltage characteristic was conducted by using a solar simulator in a standard condition of about AM 1.5 G and 1 sun (100 mW/cm$^2$).

TABLE 5

| Temperature | Jsc (mA/cm$^2$) | Voc (V) | FF | η(%) | TiO$_2$ thickness (μm) |
|---|---|---|---|---|---|
| 40° C. | 13.31 | 0.6046 | 0.513 | 4.13 | 5.5 |
| 70° C. | 13.52 | 0.6041 | 0.526 | 4.30 | 5.5 |
| 100° C. | 13.76 | 0.6172 | 0.557 | 4.73 | 5.5 |
| 130° C. | 12.07 | 0.5990 | 0.572 | 4.14 | 5.5 |
| 160° C. | 10.06 | 0.6273 | 0.588 | 3.71 | 5.3 |

In this regard, FIG. 5 is a graph for the photocurrent-voltage characteristic of the dye-sensitized solar cell produced in the Comparative Example of the present disclosure according to variation in the temperature for the heat treatment, and was prepared by using the data of Table 5 above. With reference to Table 5 above and FIG. 5, it was verified that the most superior energy conversion efficiency is achieved when the temperature for the heat treatment is about 100° C.

Figure 6:
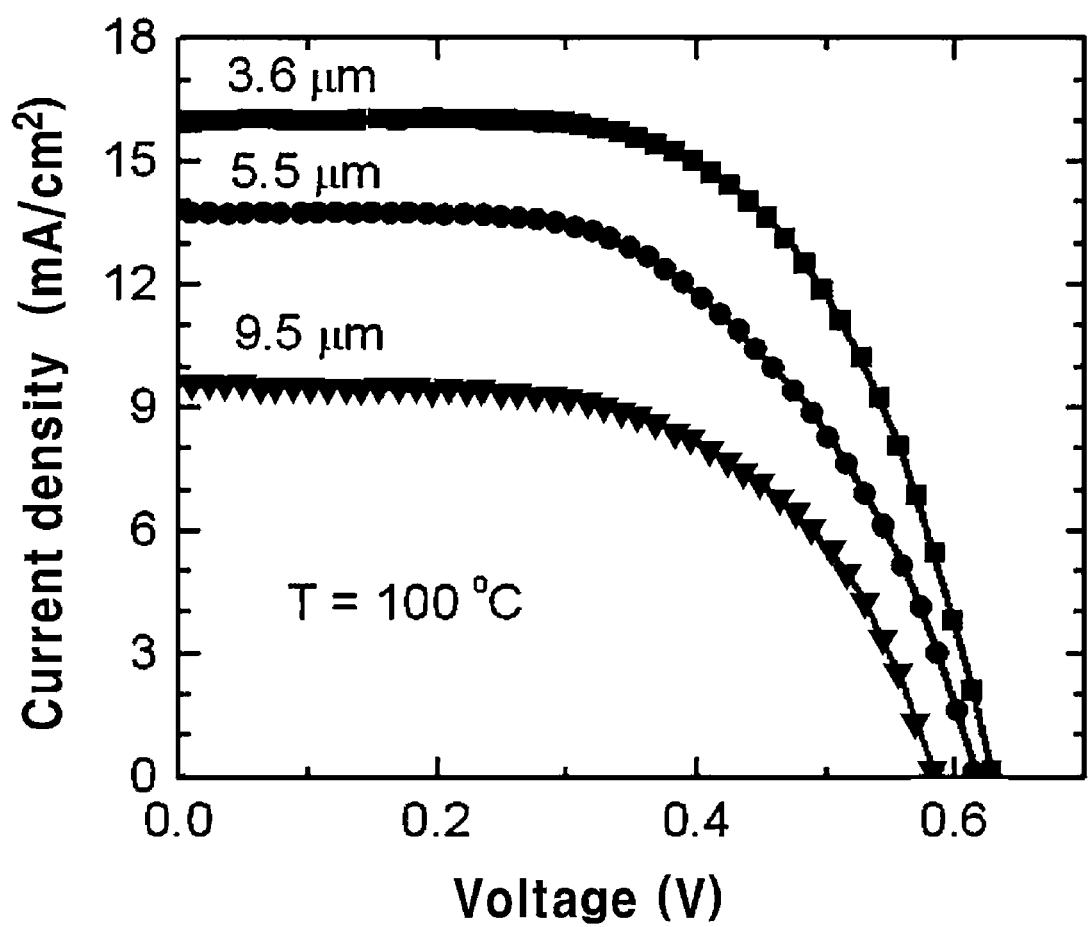
FIG. 6 is a graph for a photocurrent-voltage characteristic of the dye-sensitized solar cell produced in accordance with a Comparative Example of the present disclosure according to variation in a thickness of a semiconductor layer.

(3) Identification of a Photocurrent-Voltage Characteristic According to Variation in the Thickness of the Semiconductor Layer (FIG. 6)

Experiments for identifying a thickness of the semiconductor layer were conducted, by measuring the photocurrent-voltage characteristic of the dye-sensitized solar cell produced by the method of Item 1-(4) above, except for the thickness of the semiconductor layer. Table 6 below and FIG. 6 describe the measurement results. In this case, the measurement of the photocurrent-voltage characteristic was conducted by using a solar simulator in a standard condition of about AM 1.5 G and 1 sun (100 mW/cm$^2$).

TABLE 6

| Thickness | Jsc (mA/cm$^2$) | Voc (V) | FF | η(%) | TiO$_2$ thickness (μm) |
|---|---|---|---|---|---|
| 3.6 μm | 15.99 | 0.6288 | 0.617 | 6.20 | 3.6 |
| 5.5 μm | 13.76 | 0.6172 | 0.5567 | 4.73 | 5.5 |
| 9.8 μm | 9.593 | 0.5844 | 0.5837 | 3.27 | 9.8 |

In this regard, FIG. 6 is a graph for the photocurrent-voltage characteristic of the dye-sensitized solar cell produced in the Comparative Example of the present disclosure according to variation in the thickness of the semiconductor layer, and was prepared by using the data of Table 6 above. With reference to Table 6 above and FIG. 6, it was verified that the most superior energy conversion efficiency of about 6.20% is achieved when the thickness of the semiconductor layer is about 3.6 μm. This result is about 62% or more improvement over the maximum value of about 3.87% obtained in case of measuring the energy conversion efficiency of the dye-sensitized solar cell produced by only changing the type of the dye into a ruthenium metal complex (N719) under the same condition. However, the value is lower than the energy conversion efficiency in excess of about 8% achieved by the dye-sensitized solar cell including the hole transport layer in accordance with the first aspect of the present disclosure. From the result, it was verified that the highest efficiency can be achieved when the dye-sensitized solar cell including the hole transport layer, instead of the conventional liquid electrolyte, is produced by using the organic-inorganic composite dye having the perovskite structure, instead of the conventional ruthenium metal.

The above description of the present disclosure is provided for the purpose of illustration, and it would be understood by those skilled in the art that various changes and modifications may be made without changing technical conception and essential features of the present disclosure. Thus, it is clear that the above-described example embodiments are illustrative in all aspects and do not limit the present disclosure. For example, each component described to be of a single type can be implemented in a distributed manner. Likewise, components described to be distributed can be implemented in a combined manner.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, or device are combined in a different manner and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

We claim:

1. A solid-state perovskite solar cell, comprising:
a first electrode comprising a fluorine tin oxide (FTO) substrate;
a light absorption layer formed on the first electrode;
a hole transport layer comprising a mixture of 2,2',7,7'-Tetrakis[N,N-di(4-methoxyphenyl)amino]-9,9'-spiro-bifluorene (spiro-MeOTAD), 4-tert-Butylpyridine (tBP), and Lithium bis(trifluoromethanesulfonyl)imide (Li-TFSI) and formed on the light absorption layer; and
a second electrode comprising a gold (Au) formed on the hole transport layer,
wherein the light absorption layer includes a semiconductor layer with a $CH_3NH_3PbI_3$ dye,
wherein the semiconductor layer has a thickness range of 0.6 μm to 1.49 μm,
wherein the light absorption layer achieves an energy conversion efficiency, with respect to a total thickness of the semiconductor layer, that is greater than an energy conversion efficiency of a light absorption layer of a corresponding semiconductor layer, with absorption of the dye, of a greater total thickness within the thickness range,
wherein the solid-state perovskite solar cell does not comprise a liquid electrolyte, and
wherein the semiconductor layer includes a $TiO_2$ film coated on the FTO substrate.

2. A producing method of the solid-state perovskite solar cell according to claim 1, comprising:
forming a first electrode comprising a fluorine tin oxide (FTO) substrate;
forming a semiconductor layer on the first electrode;
adsorbing a $CH_3NH_3PbI_3$ dye to the semiconductor layer, followed by heat treatment to form a light absorption layer;
forming a hole transport layer comprising a mixture of spiro-MeOTAD, tBP, and Li-TFSI on the light absorption layer; and
forming a second electrode comprising a gold (Au) on the hole transport layer,
wherein the semiconductor layer has a thickness range of 6 μm to 1.49 μm or less,
wherein the light absorption layer achieves an energy conversion efficiency, with respect to a total thickness of the semiconductor layer, that is greater than an energy conversion efficiency of a light absorption layer of a corresponding semiconductor layer, with absorption of the dye, of a greater total thickness within the thickness range,
wherein the solid-state perovskite solar cell does not comprise a liquid electrolyte, and
wherein, the semiconductor layer includes a $TiO_2$ film coated on the FTO substrate.

3. The producing method of the solid-state perovskite solar cell of claim 2,
wherein the semiconductor layer is formed on the first electrode by a doctor blade method, a screen printing method, a spin coating method, or a spraying method.

4. The producing method of the solid-state perovskite solar cell of claim 2,
wherein the semiconductor layer has a porous structure.

5. The producing method of the solid-state perovskite solar cell of claim 2,
further comprising coating a polymer on the semiconductor layer followed by heat treatment.

6. The producing method of the solid-state perovskite solar cell of claim 5,
wherein the polymer includes a member selected from the group consisting of ethylenecellulose, hydroxypropylcellulose, polyethyleneglycol, polyethyleneoxide, polyvinylalcohol, polyvinylpyrrolidone, and combinations thereof.

7. The producing method of the solid-state perovskite solar cell of claim 2,
wherein the adsorbing comprises depositing on the semiconductor layer a solution comprising the dye in an amount of from 30 wt % to 50 wt % of the total weight of the solution.

8. The producing method of the solid-state perovskite solar cell of claim 2,
wherein forming the light absorption layer includes coating a precursor solution of the $CH_3NH_3PbI_3$ dye on the semiconductor layer, followed by heat treatment at from 40° C. to 300° C.

* * * * *